US012363935B2

(12) United States Patent
Liu et al.

(10) Patent No.: US 12,363,935 B2
(45) Date of Patent: Jul. 15, 2025

(54) METHODS FOR FORMING MULTI-GATE TRANSISTORS

(71) Applicant: Taiwan Semiconductor Manufacturing Company, Ltd., Hsin-Chu (TW)

(72) Inventors: Chang-Miao Liu, Hsinchu (TW); Wei-Lun Min, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/648,876

(22) Filed: Apr. 29, 2024

(65) Prior Publication Data

US 2024/0290870 A1    Aug. 29, 2024

Related U.S. Application Data

(62) Division of application No. 17/332,363, filed on May 27, 2021, now Pat. No. 11,973,128.

(51) Int. Cl.
| H10D 30/01 | (2025.01) |
| H10D 30/62 | (2025.01) |
| H10D 64/01 | (2025.01) |
| H10D 84/01 | (2025.01) |
| H10D 84/03 | (2025.01) |

(52) U.S. Cl.
CPC ..... *H10D 30/0243* (2025.01); *H10D 30/6211* (2025.01); *H10D 64/018* (2025.01); *H10D 84/0128* (2025.01); *H10D 84/013* (2025.01); *H10D 84/0158* (2025.01); *H10D 84/038* (2025.01)

(58) Field of Classification Search
CPC .......... H01L 29/6681; H01L 29/66553; H01L 29/7851; H01L 21/823412; H01L 21/823418; H01L 21/823431; H10D 30/0243; H10D 30/6211; H10D 84/013; H10D 64/018; H10D 84/0158; H10D 84/0128; H10D 84/038
See application file for complete search history.

(56) References Cited

U.S. PATENT DOCUMENTS

| 8,963,258 B2 | 2/2015 | Yu et al. |
| 9,818,872 B2 | 11/2017 | Ching et al. |
| 9,887,269 B2 | 2/2018 | Ching et al. |
| 9,899,398 B1 | 2/2018 | Colinge et al. |
| 9,991,352 B1 | 6/2018 | Frougier et al. |
| 10,020,261 B2 | 7/2018 | Wu et al. |
| 10,032,627 B2 | 7/2018 | Lee et al. |
| 10,109,721 B2 | 10/2018 | Lin et al. |
| 10,157,799 B2 | 12/2018 | Ching et al. |
| 10,199,502 B2 | 2/2019 | Huang et al. |

(Continued)

*Primary Examiner* — Christine A Enad
(74) *Attorney, Agent, or Firm* — HAYNES AND BOONE, LLP

(57) ABSTRACT

A semiconductor device includes a substrate, two source/drain features disposed on the substrate, a stack of channel layers disposed over the substrate and between the two source/drain features, and a gate structure disposed over and wrapping around the stack of channel layers. Each channel layer of the stack of channel layers has a dog-bone shape in a cross-sectional view including the two source/drain features and the stack of channel layers. The gate structure includes a seam.

20 Claims, 19 Drawing Sheets

(56) References Cited

U.S. PATENT DOCUMENTS

| | | | |
|---|---|---|---|
| 10,269,715 B2 | 4/2019 | Wu et al. | |
| 10,282,504 B2 | 5/2019 | Wu et al. | |
| 10,290,546 B2 | 5/2019 | Chiang et al. | |
| 10,475,902 B2 | 11/2019 | Lee et al. | |
| 10,903,317 B1 * | 1/2021 | Frougier | H01L 29/0653 |
| 2014/0011358 A1 * | 1/2014 | Chen | H01L 21/76843 |
| | | | 438/680 |
| 2015/0380509 A1 | 12/2015 | Tsai et al. | |
| 2018/0151669 A1 * | 5/2018 | Van Dal | H01L 29/7854 |
| 2018/0175036 A1 | 6/2018 | Ching et al. | |
| 2018/0315828 A1 | 11/2018 | Yamashita et al. | |
| 2019/0378911 A1 * | 12/2019 | Lee | H01L 29/78696 |
| 2020/0098756 A1 | 3/2020 | Lilak et al. | |
| 2020/0381546 A1 * | 12/2020 | Cho | H01L 29/66439 |
| 2021/0066294 A1 * | 3/2021 | Huang | H01L 29/66818 |
| 2021/0098625 A1 | 4/2021 | Tsai et al. | |
| 2022/0254884 A1 | 8/2022 | Kim et al. | |
| 2022/0278195 A1 | 9/2022 | Ando et al. | |

* cited by examiner

METHODS FOR FORMING MULTI-GATE TRANSISTORS

PRIORITY DATA

This application is a divisional application of U.S. patent application Ser. No. 17/332,363, filed May 27, 2021, which is incorporated herein by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as integrated circuit (IC) technologies progress towards smaller technology nodes, multi-gate devices have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and multi-bridge-channel (MBC) transistors are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor. The channel region of an MBC transistor may be formed from nanowires, nanosheets, or other nanostructures and for that reasons, an MBC transistor may also be referred to as a nanowire transistor or a nanosheet transistor.

Inner spacer features have been implemented in MBC transistors to space a gate structure away from epitaxial source/drain features. However, the formation of inner spacer features involves recessing sacrificial layers which are interleaved by channel layers and may result in loss of the channel layers, leading to an area-reduced junction overlap region (i.e., the interface between the channel region and the source/drain features), an increased parasitic resistance, and an increased threshold voltage Vt. Therefore, while conventional inner spacer features and channel region may be generally adequate for their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
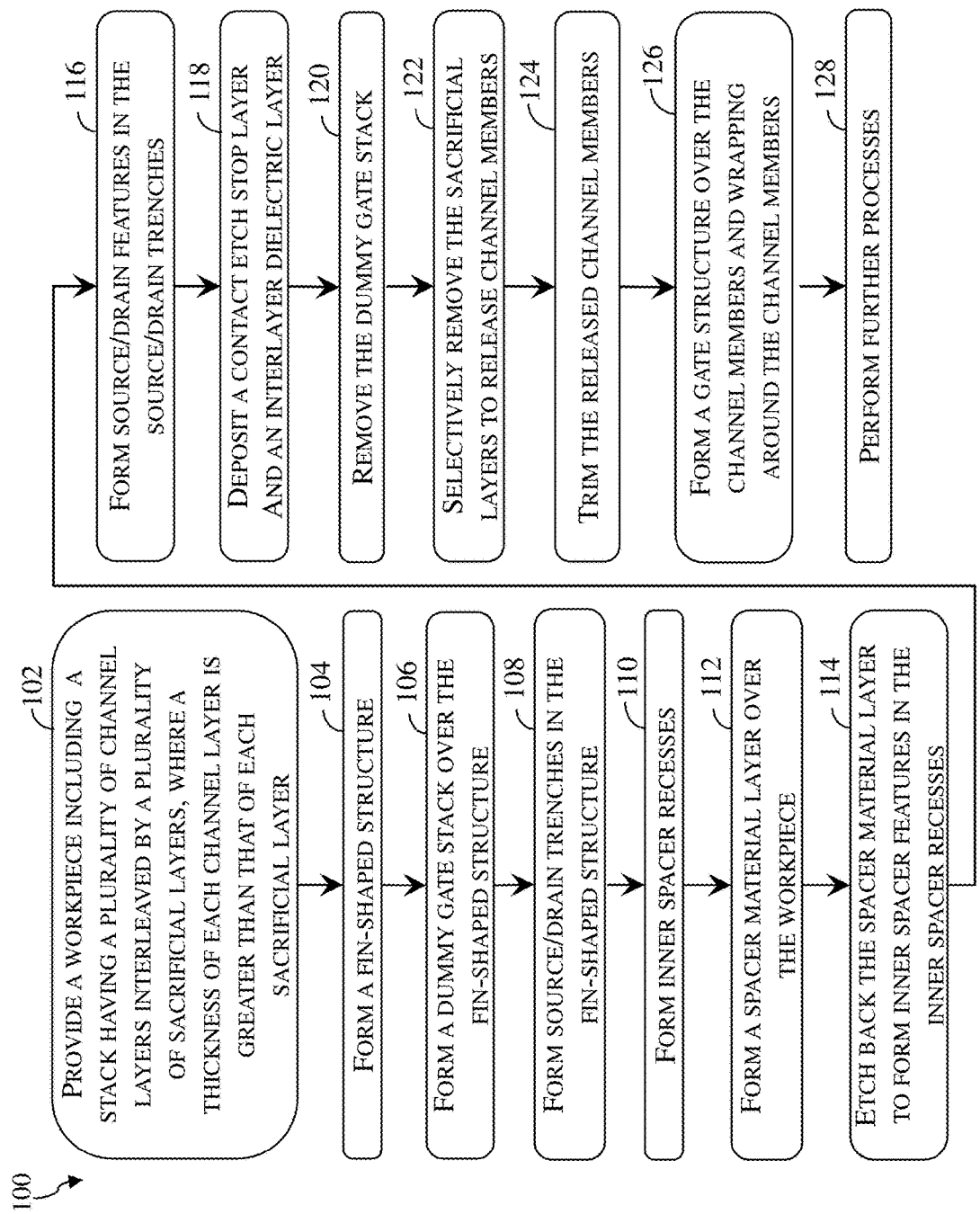
FIG. 1 illustrates a flowchart of a method for forming an exemplary semiconductor device, according to one or more aspects of the present disclosure.

It is understood that the following disclosure provides many different embodiments, or examples, for implementing different features of the present disclosure. Specific examples of components and arrangements are described below to simplify the present disclosure. These are, of course, merely examples and are not intended to be limiting. For example, the formation of a first feature over or on a second feature in the description that follows may include embodiments, in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the sake of simplicity and clarity and does not in itself dictate a relationship between the various embodiments and/or configurations discussed. Moreover, various features may be arbitrarily drawn in different scales for the sake of simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

Multi-gate devices, such as an MBC transistor, have been introduced to improve gate control by increasing gate-channel coupling, reducing off-state current, and reducing short-channel effects (SCEs). Formation of an MBC transistor includes formation of a stack that includes a number of channel layers interleaved by a number of sacrificial layers, where the sacrificial layers may be selectively removed to release the channel layers as channel members. A gate structure, which includes multiple dielectric and conductive layers, is then formed to wrap around each of the channel members. In some existing technologies, a thickness of each sacrificial layer is substantially equal to or greater than a thickness of each channel layer such that the removal of the sacrificial layers would provide satisfactory gate fill window. The composition of the sacrificial layers is selected to ensure selective removal of the sacrificial layers without introducing substantial damages to the channel layers. In these existing technologies, a uniform dimension of each channel member along the gate length is desired to ensure uniform gate control throughout each channel member.

Parasitic resistance may bog down the performance of these existing MBC transistors as the feature dimensions continue to scale down. An on-state resistance of an MBC transistor includes a channel resistance component $R_{channel}$ associated with the channel region of the transistor, a junction resistance component $R_{overlay}$ associated with the junction overlay region (i.e., an areal interface between the source/drain feature and channel region), and a plug resistance component $R_p$ associated with traces (e.g., metal lines and contact vias) and contacts (e.g., contact resistance between source/drain contacts and silicide). In some existing technologies, inner spacer features are implemented to cap two ends of the sacrificial layers to protect source/drain features from being damaged during the channel release process. To form the inner spacer features, sacrificial layers are selectively and partially recessed to form inner spacer recesses and then one or more suitable dielectric materials are deposited in the inner spacer recesses. However, the selective etching process used to form the inner spacer recesses may also etch end portions of the channel layers, leading to a reduced junction overlay region and thus an increased junction resistance $R_{overlay}$. The increased junction resistance $R_{overlay}$ leads to an increased on-state resistance, causing a reduced on-state current, a reduced switching speed, and/or an increased threshold voltage.

The present disclosure provides embodiments of forming a semiconductor device with a reduced junction resistance $R_{overlay}$. The method includes forming a stack including a number of channel layers interleaved by a number of sacrificial layers. Each of the channel layers is thicker than each of the sacrificial layers. For example, a ratio of a thickness of the channel layer to a thickness of the sacrificial layer may be between about 1.5 and about 3. To provide satisfactory gate fill windows, after the channel layers are released to form channel members by selectively removing the sacrificial layers, the channel members are trimmed to increase channel-channel spacing. To prevent undesirable damages to source/drain features during the channel trimming process, the method of the present disclosure forms inner spacers that are wider along the gate length direction. In some instances, a ratio of a width of the inner spacer feature to a height of the inner spacer feature is between about 0.9 and about 1.2. Due to the channel trimming process, a shape of a cross-sectional view of a channel member (i.e., the trimmed channel layers) includes or resembles a dog-bone shape, a dumbbell shape, or a barbell shape. In some instances, the dog-bone channel member includes a channel portion wrapped around by a gate structure and two connection portions sandwiched between two inner spacer features. The interface between a connection portion and an adjacent source/drain feature is referred to as a junction overlay region. In some implementations, a height (along the Z direction) of the junction overlap region is twice the height of the channel portion. Because the area of the junction overlay region is increased, the junction resistance $R_{overlay}$ and thus the on-state resistance may be advantageously reduced, and the device performance may be improved.

Various aspects of the present disclosure will now be described in more detail with reference to the figures. FIG. 1 illustrates a flowchart of a method 100 of forming a semiconductor device from a workpiece according to one or more aspects of the present disclosure. Method 100 is merely an example and is not intended to limit the present disclosure to what is explicitly illustrated in method 100. Additional steps may be provided before, during and after method 100, and some steps described can be replaced, eliminated, or moved around for additional embodiments of the methods. Not all steps are described herein in detail for reasons of simplicity. Method 100 is described below in conjunction with FIGS. 2-19, which are fragmentary cross-sectional views of the workpiece at different stages of fabrication according to embodiments of method 100. For avoidance of doubts, the X, Y and Z directions in FIGS. 2-19 are perpendicular to one another and are used consistently throughout FIGS. 2-19. Because the workpiece 200 will be fabricated into a semiconductor device, the workpiece 200 may be referred to herein as a semiconductor device 200 as the context requires. Throughout the present disclosure, like reference numerals denote like features unless otherwise excepted or described.

Figure 2:
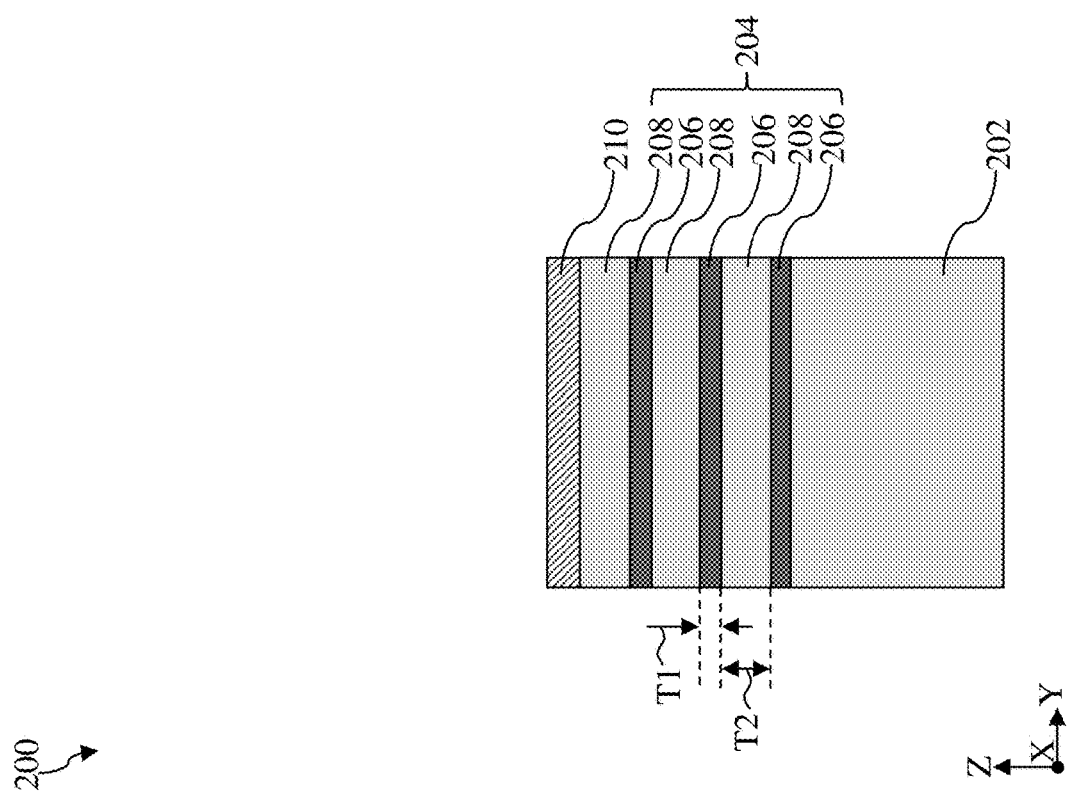
FIGS. 2-15 and 17 illustrate fragmentary cross-sectional views of an exemplary workpiece during various fabrication stages in the method of FIG. 1, according to one or more aspects of the present disclosure.

Referring to FIGS. 1 and 2, method 100 includes a block 102 where a workpiece 200 is provided. The workpiece 200 includes a substrate 202. Although not explicitly shown in the figures, the substrate 202 may include an n-type well region and a p-type well region for fabrication of transistors of different conductivity types. In one embodiment, the substrate 202 may be a silicon (Si) substrate. In some other embodiments, the substrate 202 may include other semiconductors such as germanium (Ge), silicon germanium (SiGe), or a III-V semiconductor material. Exemplary III-V semiconductor materials may include gallium arsenide (GaAs), indium phosphide (InP), gallium phosphide (GaP), gallium nitride (GaN), gallium arsenide phosphide (GaAsP), aluminum indium arsenide (AlInAs), aluminum gallium arsenide (AlGaAs), gallium indium phosphide (GaInP), and indium gallium arsenide (InGaAs). The substrate 202 may also include an insulating layer, such as a silicon oxide layer, to have a silicon-on-insulator (SOI) structure. When present, each of the n-type well and the p-type well is formed in the substrate 202 and includes a doping profile. An n-type well may include a doping profile of an n-type dopant, such as phosphorus (P) or arsenic (As). A p-type well may include a doping profile of a p-type dopant, such as boron (B). The doping in the n-type well and the p-type well may be formed using ion implantation or thermal diffusion and may be considered portions of the substrate 202.

As shown in FIG. 2, the workpiece 200 also includes a stack 204 disposed over the substrate 202. The stack 204 includes a number of sacrificial layers 206 and a number of channel layers 208 interleaved by the number of sacrificial layers 206. The channel layers 208 and the sacrificial layers 206 may have different semiconductor compositions. In some implementations, the channel layers 208 are formed of silicon (Si) and the sacrificial layers 206 are formed of silicon germanium (SiGe). In an embodiment, a germanium content of the sacrificial layer 206 is between about 15% and about 30%. When the germanium content is less than 15%, a prolonged etching duration may be applied to remove the sacrificial layers 206 in a subsequent channel release process, which may damage other features adjacent to the sacrificial layers. Furthermore, a low germanium content may lead to a low etch selectivity between the sacrificial layers 206 and the channel layers 208. The sacrificial layers 206 may not be selectively removed without substantially etching the channel layers 208, leading to a reduced junction overlay region and an increased parasitic resistance. When the germanium content is greater than 30%, more germanium would diffuse into the channel layers 208, increasing an impurity concentration in the channel layers 208 and degrading the device performance. Also, a higher concentration of germanium content in the sacrificial layers 206 may cause crystalline defects, such as dislocations. In an embodiment, to achieve a reduced impurity concentration in the channel layer, the germanium content of the silicon germanium is between about 15% and about 25%. In an embodiment, the germanium content of the silicon germanium is between about 17% and about 22% to achieve a better tradeoff between the impurity concentration and the etch selectivity between the sacrificial layers 206 and the channel layers 208.

Each sacrificial layer 206 has a thickness T1 and each channel layer 208 has a thickness T2. In an embodiment, a ratio of T2 to T1 (i.e., T2/T1) is between about 1.5 and about 3. When the ratio is greater than 3, after removing the sacrificial layers and releasing the channel layers, the channel-channel spacing would be too small, increasing the difficulty of forming satisfactory gate structures. When ratio is less than 1.5, the final structure of the semiconductor device 200 would have a smaller junction overlay region, causing a large junction resistance $R_{overlay}$ and thus a large on-state resistance. In an embodiment, based on the performance demand, a ratio of T2 to T1 (i.e., T2/T1) is between about 1.7 and about 2.5. In some embodiments, a sum of T1 and T2 (i.e., T1+T2) is between about 13 nm and 19 nm. When the sum is greater than 19 nm, the aspect ratio of the stack 204 may be increased, leading to an increased process challenge. In addition, parasitic capacitance related to the semiconductor device 200 may also increase, which would disadvantageously affect the performance of the semiconductor device 200. When the sum is less than 13 nm, a reduced thickness of the channel layer 208 and/or the sacrificial layer 206 may increase the epitaxy difficulty for forming satisfactory layers in the stack 204 and reduce the process window for forming satisfactory gate structures wrapping around nanostructures. In some embodiments, the thickness T1 of each sacrificial layer 206 is between about 3.5 nm and about 5.5 nm, the thickness T2 of each channel layer 208 is between about 10.5 nm and about 12.5 nm, thereby allowing the formation of a larger junction overlay region and thus achieving a smaller junction resistance $R_{overlay}$ without increasing the difficulty of forming satisfactory gate structures. As generally described above and further described below in more detail, the greater thickness of the channel layers 208 and the implementation of channel trimming process would form channel members that resemble a dumbbell or a dog bone with an enlarged end portion. Although the non-uniform dimensions of the resulting channel members may lead to reduced gate control comparing to the MBC transistors with channel members having a uniform shape and thus a uniform thickness, the dumbbell or dog bone shapes provide benefits. For example, a final structure with a dog-bone shape channel member (to be described in further detail with reference to FIGS. 14-18) and a large overlay junction region would be formed, leading to a reduced junction resistance $R_{overlay}$.

In some embodiments, the sacrificial layers 206 and channel layers 208 may be deposited using an epitaxial process. Suitable epitaxial processes include vapor-phase epitaxy (VPE), ultra-high vacuum chemical vapor deposition (UHV-CVD), molecular beam epitaxy (MBE), and/or other suitable processes. As shown in FIG. 2, the sacrificial layers 206 and the channel layers 208 are deposited alternatingly, one-after-another, to form the stack 204. It is noted that three layers of the sacrificial layers 206 and three layers of the channel layers 208 are alternately and vertically arranged as illustrated in FIG. 2, which are for illustrative purposes only and not intended to be limiting beyond what is specifically recited in the claims. It is understood that any number of sacrificial layers and channel layers can be formed in the stack 204. The number of layers depends on the desired number of channels members for the device 200. In some embodiments, the number of the channel layers 208 is between 2 and 10. For patterning purposes, a hard mask layer 210 may be deposited over the stack 204. The hard mask layer 210 may be a single layer or a multilayer. In one example, the hard mask layer 210 includes a silicon oxide layer and/or a silicon nitride layer. The patterning process may include a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof.

Figure 3:
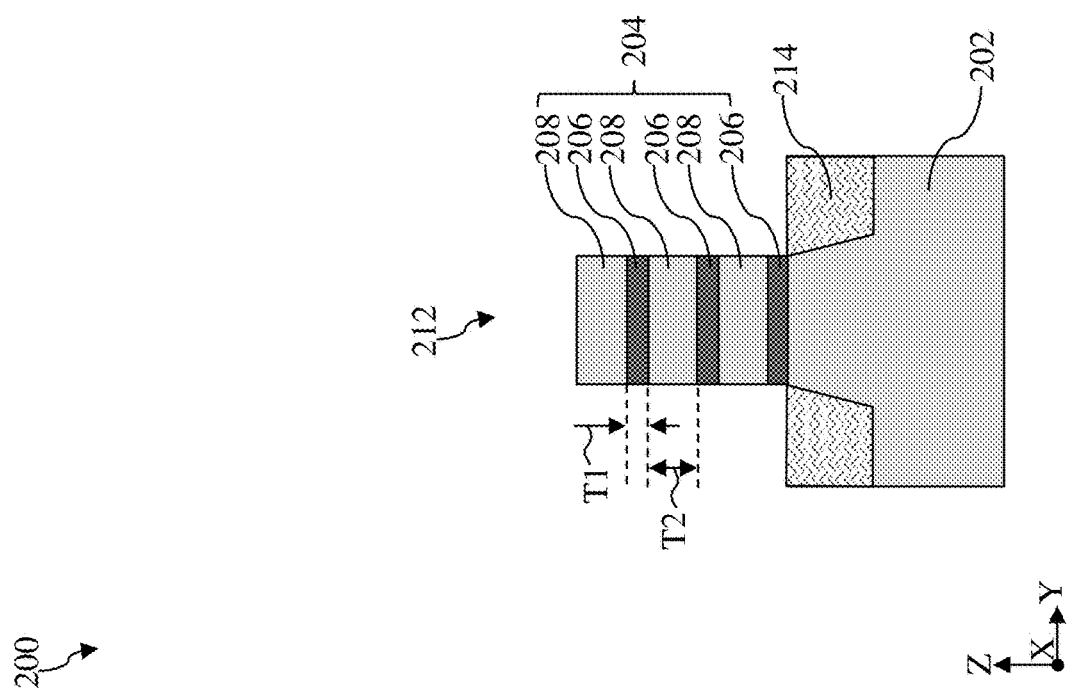

Referring to FIGS. 1 and 3, method 100 includes a block 104 where a fin-shaped structure 212 is formed from the stack 204. In some embodiments, the stack 204 and a portion of the substrate 202 are patterned to form the fin-shaped structure 212. As shown in FIG. 3, the fin-shaped structure 212 extends vertically along the Z direction from the substrate 202. The fin-shaped structure 212 includes a base portion formed from the substrate 202 and a stack portion formed from the stack 204. The fin-shaped structure 212 may be patterned using suitable processes including double-patterning or multi-patterning processes. As shown in FIG. 3, operations at block 104 also include formation of an isolation feature 214 adjacent and around the base portion of the fin-shaped structure 212. The isolation feature 214 is disposed between the fin-shaped structure 212 and another fin-shaped structure 212. The isolation feature 214 may also be referred to as a shallow trench isolation (STI) feature 214. In some embodiments, the isolation feature 214 may include silicon oxide, silicon nitride, silicon oxynitride, fluorine-doped silicate glass (FSG), a low-k dielectric, combinations thereof, and/or other suitable materials. The formation of the isolation feature 214 may involve multiple processes such as deposition and etching. As shown in FIG. 3, the stack portion of the fin-shaped structure 212 rises above the isolation feature 214. Although not explicitly shown in FIG. 3, the hard mask layer 210 may also be removed during the formation of the isolation feature 214.

Figure 4:
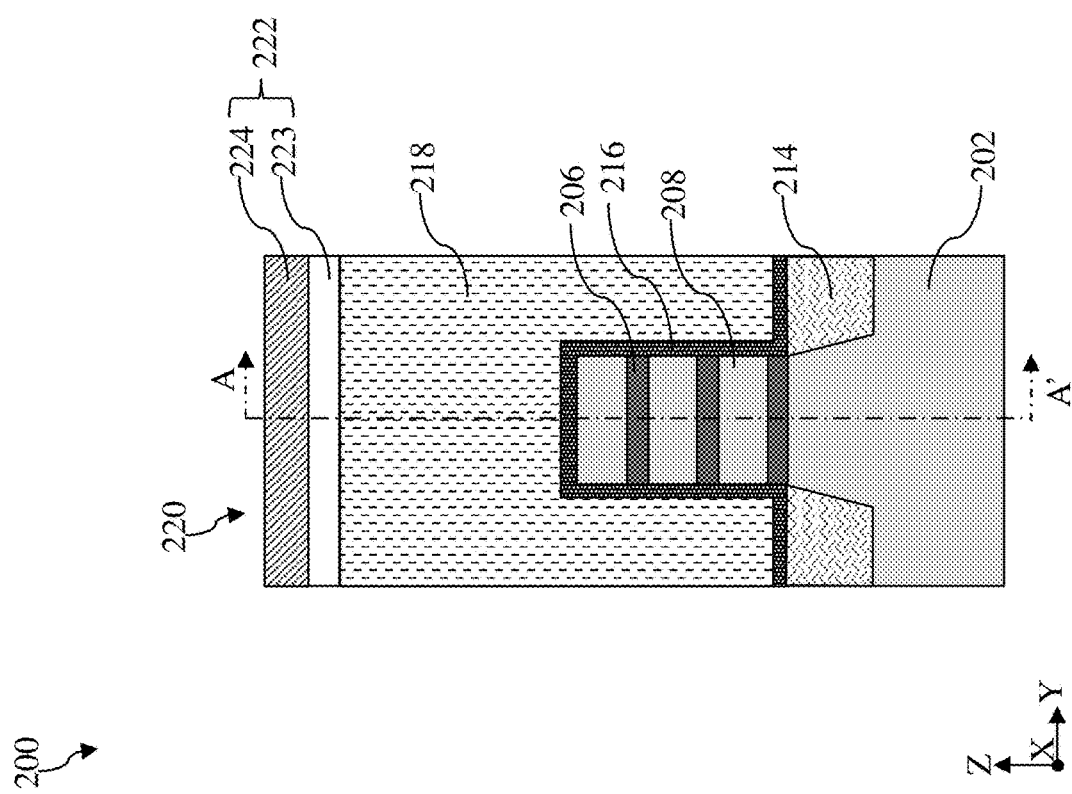
Figure 5:
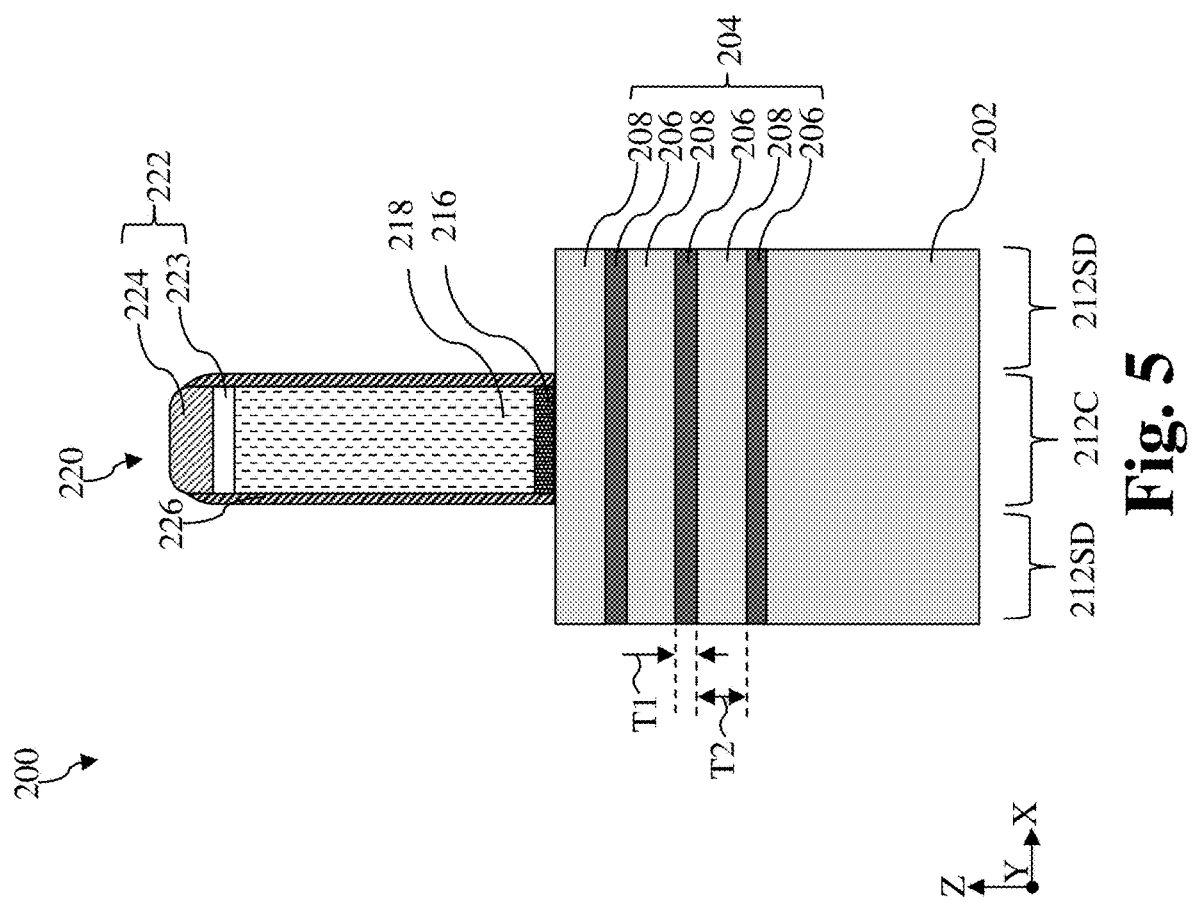

Referring to FIGS. 1 and 4-5, method 100 includes a block 106 where a dummy gate stack 220 is formed over the fin-shaped structure 212. In some embodiments, a gate replacement process (or gate-last process) is adopted where the dummy gate stack 220 serves as placeholders for a functional gate structure. Other processes and configuration are possible. In some embodiments, the dummy gate stack 220 is formed over the isolation feature 214 and is at least partially disposed over the fin-shaped structures 212. As shown in FIG. 4, the dummy gate stack 220 extends lengthwise along the Y direction to wrap over the fin-shaped structure 212.

In embodiments represented in FIG. 4, the dummy gate stack 220 includes a dummy dielectric layer 216 and a dummy gate electrode 218. In an exemplary process, the dummy dielectric layer 216, a dummy electrode layer for the dummy gate electrode 218, and a gate top hard mask layer 222 are sequentially deposited over the workpiece 200, including over the fin-shaped structure 212. In some embodiments, the dummy dielectric layer 216 may include silicon oxide and the dummy gate electrode 218 may include polycrystalline silicon (polysilicon). In some instances, the gate top hard mask layer 222 may be a multilayer and may include a first hard mask 223 and a second hard mask 224 over the first hard mask 223. The first hard mask 223 may include silicon oxide and the second hard mask 224 may include silicon nitride. In some embodiments, the dummy gate stack 220 is formed by various process steps such as layer deposition, patterning, etching, as well as other suitable processing steps. Exemplary layer deposition processes include low-pressure CVD (LPCVD), CVD, plasma-enhanced CVD (PECVD), PVD, atomic layer deposition (ALD), thermal oxidation, e-beam evaporation, or other suitable deposition techniques, or combinations thereof. In some embodiments, the etching process may include dry etching (e.g., RIE etching), wet etching, and/or other etching methods. The dummy dielectric layer 216 and the dummy electrode layer are then patterned using photolithography processes to form the dummy gate stack 220.

Referring to FIG. 5, which is a fragmentary cross-sectional view of the workpiece 200 taken along line A-A' shown in FIG. 4, after the formation of the dummy gate stack 220, a gate spacer layer 226 is formed over sidewalls of the dummy gate stack 220. In some embodiments, the formation of the gate spacer layer 226 includes conformal deposition of one or more dielectric layers over the workpiece 200 and etch-back of the gate spacer layer 226 from top-facing surfaces of the workpiece 200 by an anisotropic etch process. In an exemplary process, the one or more dielectric layers are deposited using CVD, SACVD, or ALD. The gate spacer layer 226 may include silicon oxide, silicon nitride, silicon carbide, silicon oxynitride, silicon carbonitride, silicon oxycarbide, silicon oxycarbonitride, and/or combinations thereof. As shown in FIG. 5, the fin-shaped structure 212 includes a channel region 212C underlying the dummy gate stack 220 and source/drain regions 212SD that are not vertically overlapped by the dummy gate stack 220. The channel region 212C is disposed between two source/drain regions 212SD. It is noted that because the cross-sectional view in FIG. 5 slices through the fin-shaped structure 212, the isolation feature 214 is not shown in FIG. 5.

Figure 6:
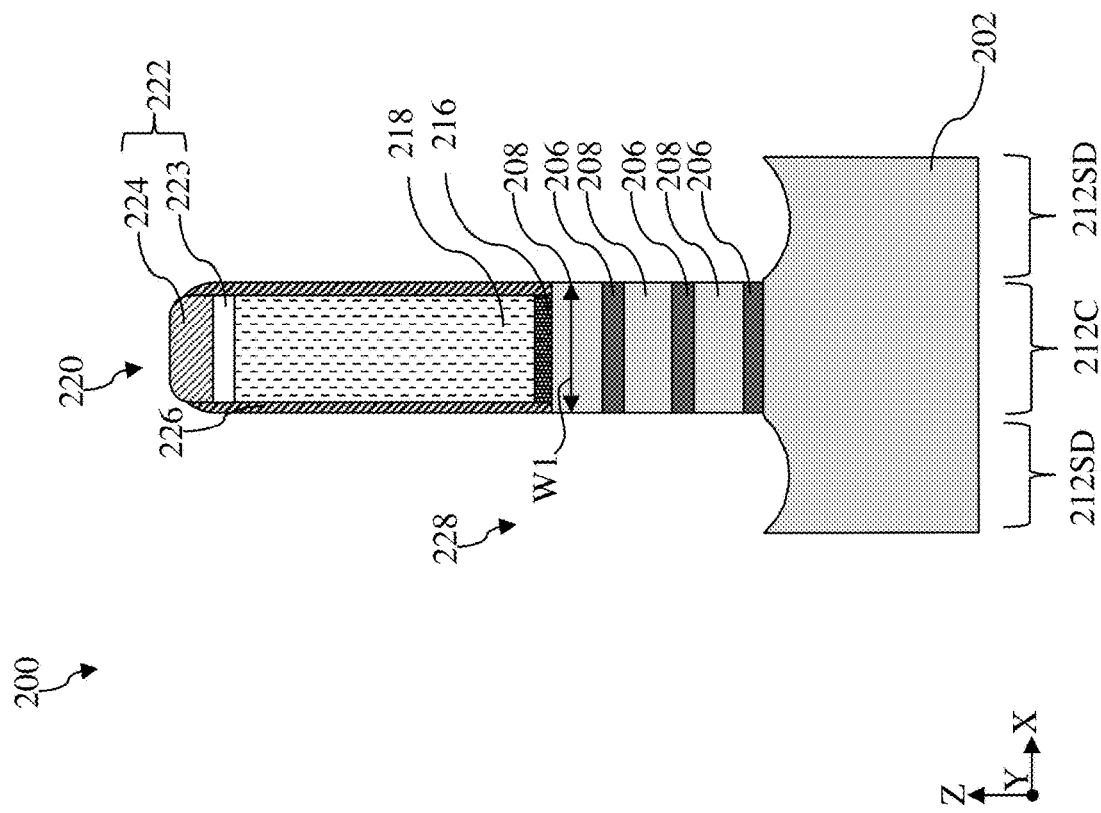

Referring to FIGS. 1 and 6, method 100 includes a block 108 where source/drain trenches 228 are formed in the fin-shaped structure 212. In embodiments represented in FIG. 6, the source/drain regions 212SD of the fin-shaped structure 212, which are not covered by the gate top hard mask layer 222 and the gate spacer layer 226, are recessed to form the source/drain trenches 228. The etch process at block 108 may be a dry etch process or a suitable etch process. The dry etch process may implement an oxygen-containing gas, hydrogen, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. As shown in FIG. 6, sidewalls of the sacrificial layers 206 and the channel layers 208 are exposed in the source/drain trenches 228. In some embodiments, considering the packing density and performance demand, a width W1 (along the X direction) of the channel region 212C is between about 22 nm and about 30 nm.

Figure 7:
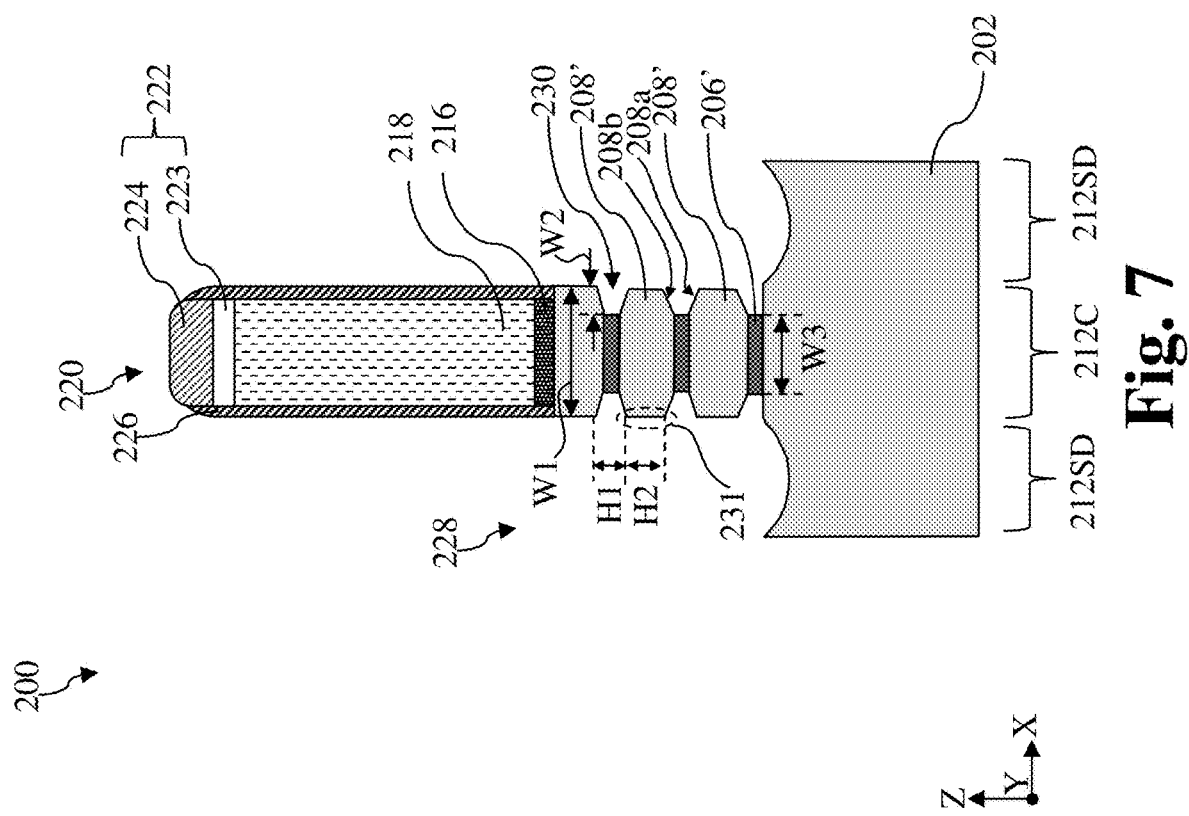

Referring to FIGS. 1 and 7, method 100 includes a block 110 where inner spacer recesses 230 are formed. The sacrificial layers 206 exposed in the source/drain trenches 228 are selectively and partially recessed to form inner spacer recesses 230. For ease of reference, the recessed sacrificial layers 206 may also be referred to as sacrificial layers 206'. As shown in FIG. 7, the channel layers 208 are also etched at block 110 and the inner spacer recesses 230 partially extend along the Z direction into the channel layers 208. For ease of reference, the etched channel layer 208 may also be referred to as channel layer 208'. In some embodiments, the selective recess in block 110 may be a selective isotropic etching process (e.g., a selective dry etching process or a selective wet etching process), and the extent at which the sacrificial layers 206 and the semiconductor layers 208 are recessed is controlled by duration of the etching process. The selective dry etching process may include use of one or more fluorine-based etchants, such as fluorine gas or hydrofluorocarbons. The selective wet etching process may include a hydro fluoride (HF) or $NH_4OH$ etchant.

Still referring to FIG. 7, after the selective recess in block 110, each of the inner spacer recesses 230 has a width W2 (along the X direction). In some embodiments, a ratio of the width W2 of the inner spacer recess 230 to the width W1 of the channel region 212C is between about 0.15 and about 0.25 such that the to-be-formed inner spacer features 240 would be thick enough to protect source/drain features (242, shown in FIG. 10) from being damaged during a subsequent trimming process (will be described with reference to FIG. 14) while not sacrificing too much gate control. In some implementations where the width W1 of the channel region 212C is between about 22 nm and about 30 nm, the width W2 may be between about 4 nm and about 8 nm. The width W2 of the inner spacer recess 230 is inversely related to a width W3 of the sacrificial layers 206'. In some implementations, a ratio of the width W3 of the sacrificial layers 206' to the width W1 of the channel region 212C is between about 0.5 and about 0.7 to facilitate the formation of a satisfactory gate structure. In an embodiment, the width W3 of the sacrificial layers 206' is between about 16 nm and about 22 nm.

Each of the inner spacer recesses 230 has a height H1 (along the Z direction) no less than the thickness T1 of the sacrificial layer 206 to ensure gate structures and source/ drain features are spaced apart in the final structure of the semiconductor device 200. In some implementations, to form the inner spacer recess 230 with the above-mentioned width W2, a height H1 of the inner spacer recess 230 is between about 4 nm and about 8 nm. A ratio of the height H1 of the inner spacer recess 230 to the thickness T1 of the sacrificial layer 206 (i.e., H1/T1) is between about 1.1 and about 1.5, a ratio of the width W2 of each inner spacer recess 230 to the height H1 of each inner spacer recess 230 is between about 0.9 and about 1.2. In an embodiment, H1 is substantially equal to W2. As shown in FIG. 7, a height H2 of a junction overlay region 231 (i.e., an interface of the channel layer 208' to be in direct contact with source/drain features 242 shown in FIG. 10) is inversely related to the height H1 of the inner spacer recess 230. When the height H1 of the inner spacer recesses 230 is greater than about 8 nm, the height H2 of the junction overlay region 231 would be too small, leading to a large junction resistance $R_{overlay}$. In some embodiments, due to the thickness limitation of the sacrificial layer 206 and the height H1 of the inner spacer recesses 230, a ratio of the height H2 to the thickness T2 of the channel layer 208 is between about 0.65 and about 0.95 such that the final structure of the semiconductor device 200 would provide a smaller junction resistance $R_{overlay}$ and thus a smaller on-state resistance without increasing the difficulty of forming satisfactory gate structures. In an embodiment, the height H2 of the junction overlay region 231 may be between about 8 nm and about 12 nm.

In this depicted embodiment, after the etching process for forming the inner spacer recess 230 with the above-mentioned dimensions, the channel layer 208' includes a tilted top surface 208a and a tilted bottom surface 208b exposed by the inner spacer recesses 230. The top surface 208a and the bottom surface 208b tilt inward. An angle between the tilted top surface 208a and the X axis is between about 5° and about 15°. In some other implementations, after the etching process, the shape of the cross-sectional view of the channel layer 208' includes a concave top surface 208a' and a concave bottom surface 208b' exposed by corresponding inner spacer recesses. An enlarged cross-sectional view of another exemplary channel region with concave top and bottom surfaces would be described in further detail with reference to FIG. 19.

Figure 8:
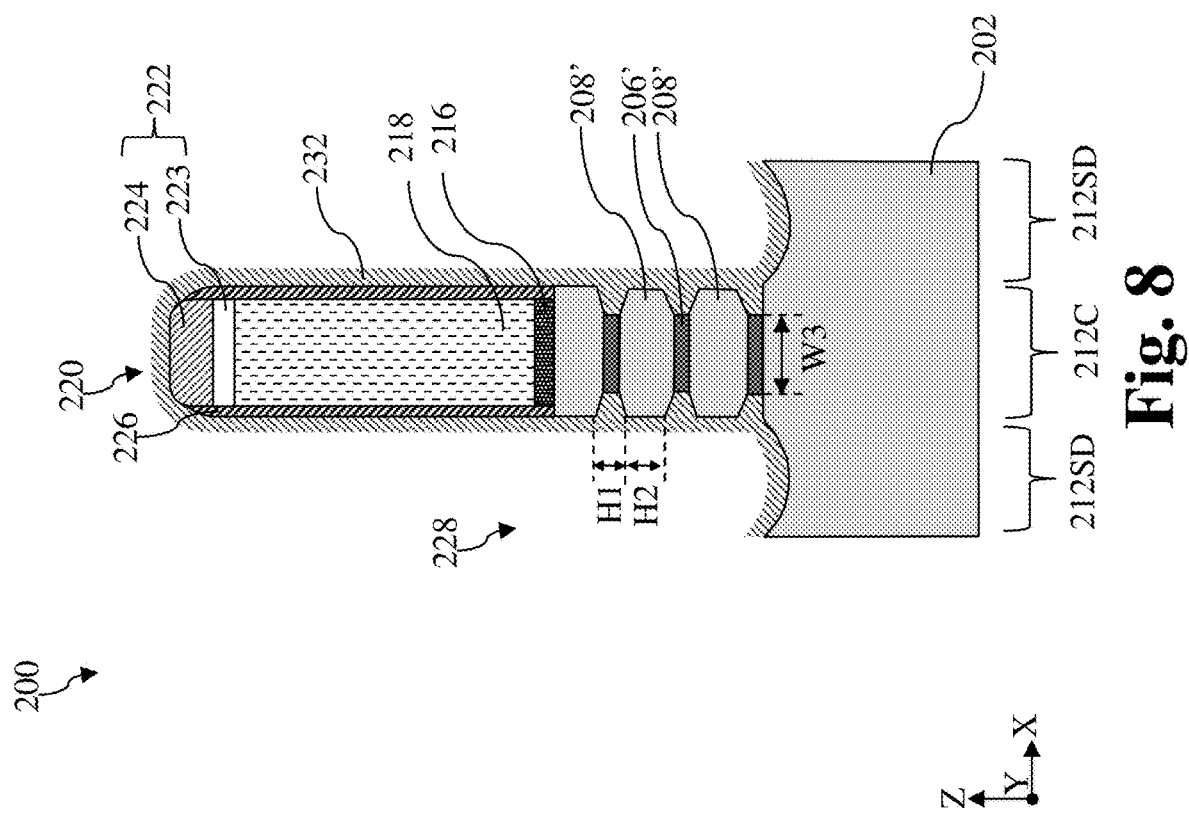

Referring to FIGS. 1 and 8, method 100 includes a block 112 where a spacer material layer 232 is formed over the workpiece 200. The spacer material layer 232 may be deposited using ALD and may include silicon oxide, silicon nitride, silicon oxycarbide, silicon oxycarbonitride, silicon carbonitride, metal nitride, or a suitable dielectric material. The spacer material layer 232 is deposited to a thickness between about 7.5 nm and about 9.5 nm such that it is sufficiently thick to fill the inner spacer recesses 230.

Figure 9:
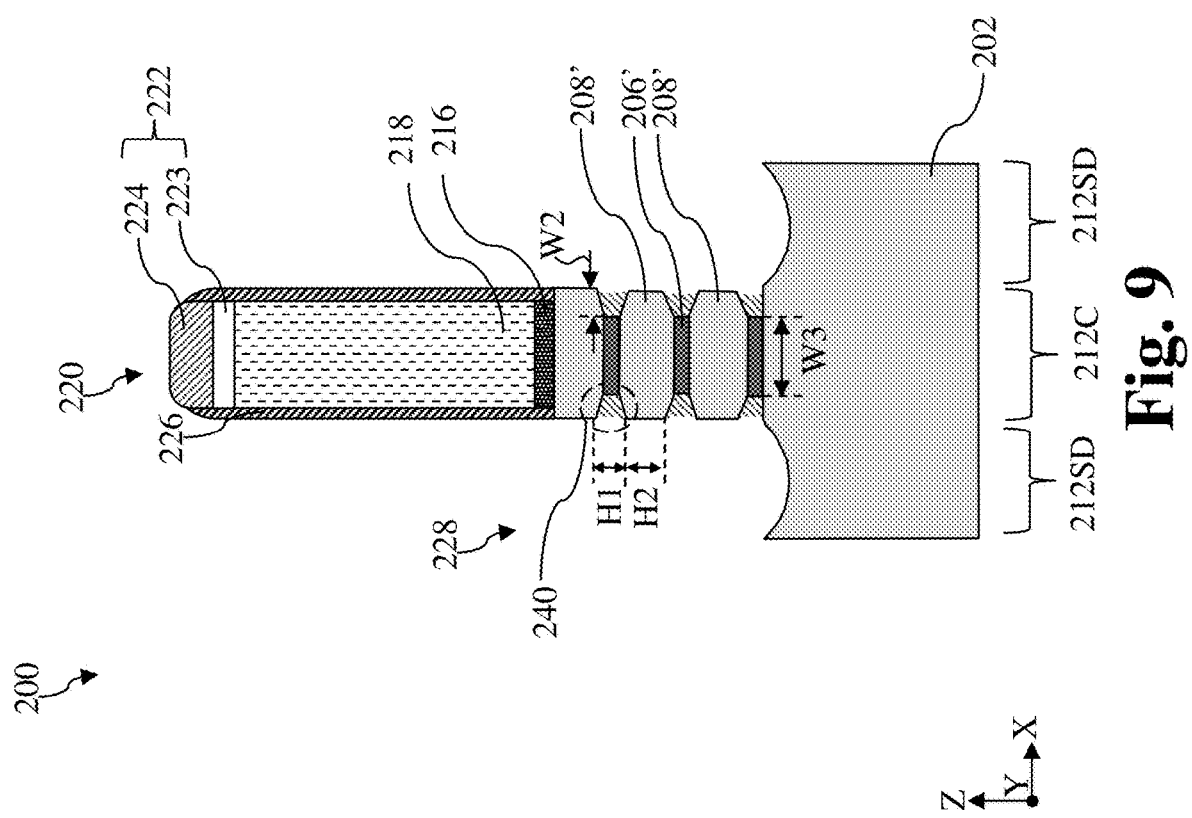

Referring to FIGS. 1 and 9, method 100 includes a block 114 where the spacer material layer 232 is etched back to form inner spacer features 240. The etch back process removes the spacer material layer 232 on the channel layers 208', the substrate 202, and the gate spacer layer 226 to form the inner spacer features 240 in the inner spacer recesses 230. In some embodiments, the etch back process at block 114 may be a dry etch process similar to that used for forming source/drain trenches 228 described with reference to FIG. 6. Because each of the inner spacer features 240 is formed into each of the inner spacer recesses 230, the shapes and dimensions of each inner spacer feature 240 track those of the corresponding inner spacer recess 230 defined by the sacrificial layers 206' and channel layer 208'. That is, each of the inner spacer features 240 has corresponding titled surfaces 208a/208b or concave surfaces 208a'/208b' and has a width W2 along the X direction and a height H1 along the Z direction. Therefore, as described earlier, the inner spacer features 240 are able to isolate a gate structure from source/drain features, provide a larger junction overlay region 231, and protect source/drain features from being damaged during a subsequent trimming process without sacrificing too much space for forming gate structures.

Figure 10:
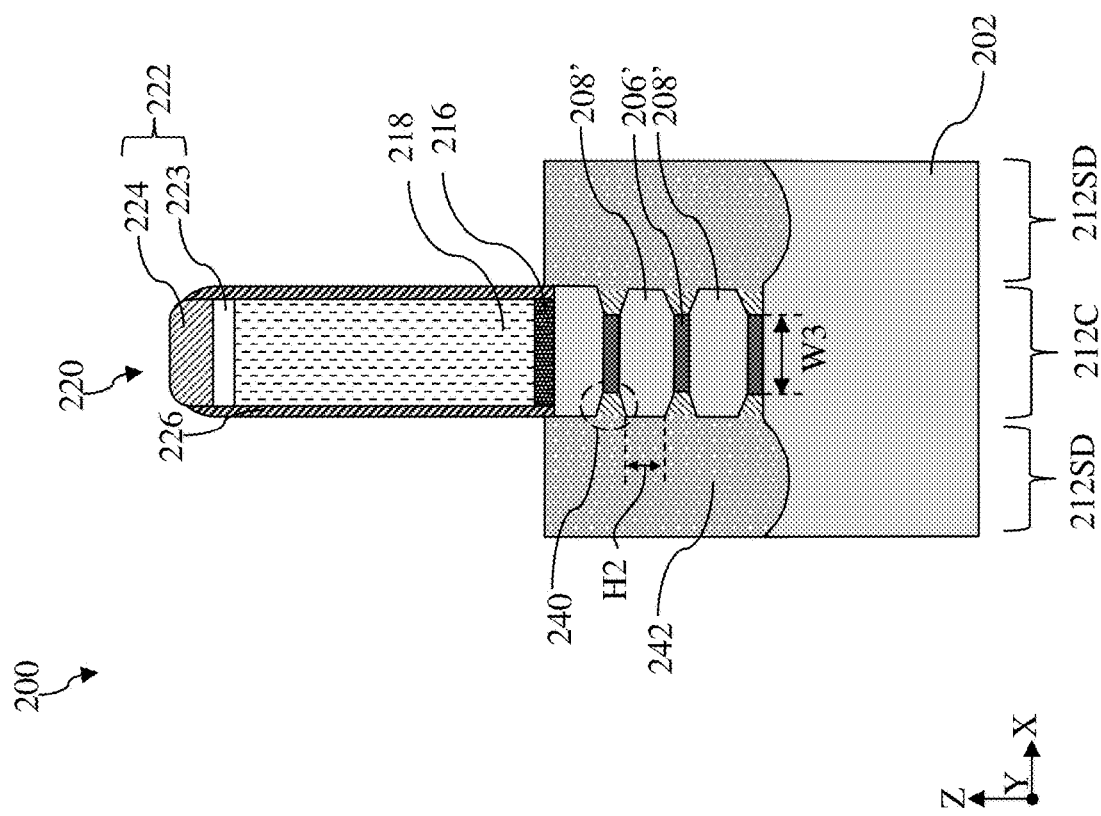

Referring to FIGS. 1 and 10, method 100 includes a block 116 where source/drain features 242 are formed in the source/drain trenches 228. As shown in FIG. 10, the source/drain features 242 are spaced apart from the sacrificial layers 206' by the inner spacer features 240. In some embodiments, the source/drain features 242 may be formed by using an epitaxial process, such as VPE, UHV-CVD, MBE, and/or other suitable processes. The epitaxial growth process may use gaseous and/or liquid precursors, which interact with the composition of the substrate 202 as well as the channel layers 208'. Depending on the conductivity type of the to-be-formed MBC transistor, the source/drain features 242 may be n-type source/drain features or p-type source/drain features. Exemplary n-type source/drain features may include Si, GaAs, GaAsP, SiP, or other suitable material and may be in-situ doped during the epitaxial process by introducing an n-type dopant, such as phosphorus (P), arsenic (As), or ex-situ doped using an implantation process (i.e., a junction implant process). Exemplary p-type source/drain features may include Si, Ge, AlGaAs, SiGe, boron-doped SiGe, or other suitable material and may be in-situ doped during the epitaxial process by introducing a p-type dopant, such as boron (B), or ex-situ doped using an implantation process (i.e., a junction implant process).

Figure 11:
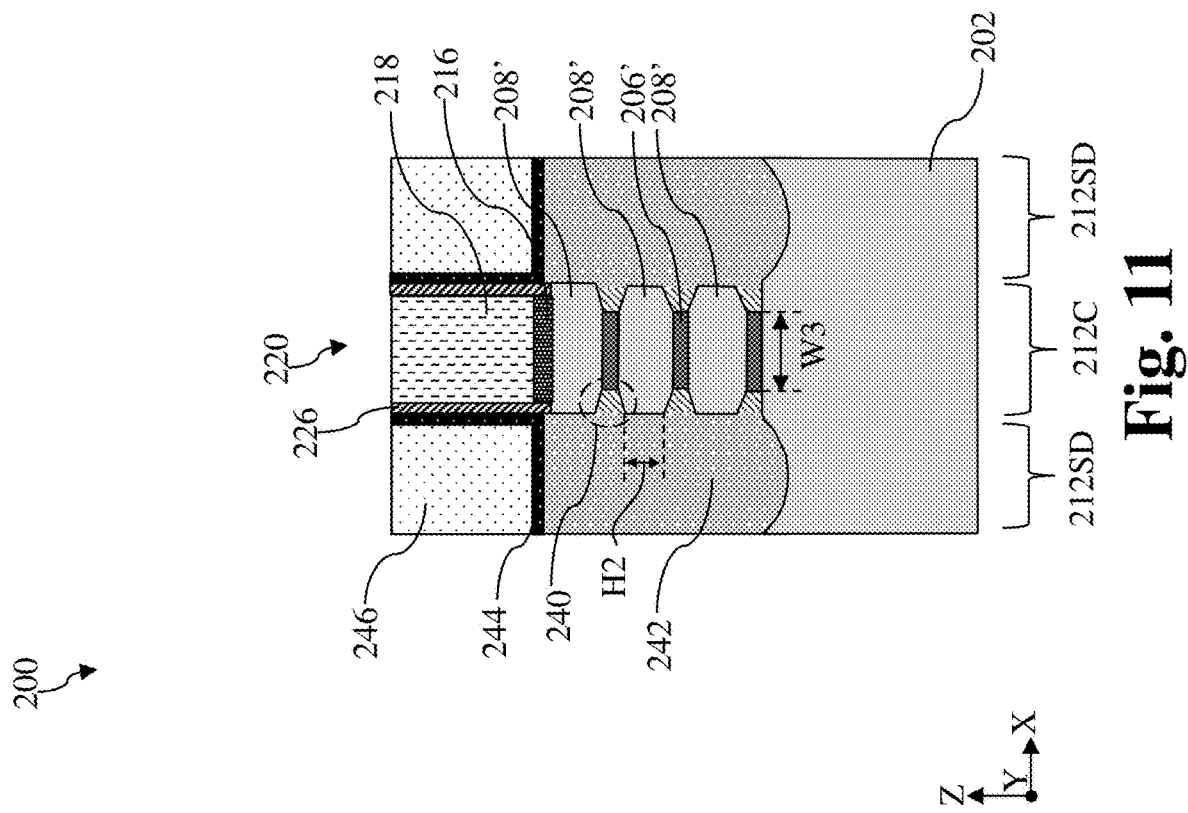

Referring to FIGS. 1 and 11, method 100 includes a block 118 where a contact etch stop layer (CESL) 244 and an interlayer dielectric (ILD) layer 246 are deposited over the workpiece 200. The CESL 244 may include silicon nitride, silicon oxide, silicon oxynitride, and/or other materials known in the art and may be formed by ALD, plasma-enhanced chemical vapor deposition (PECVD) process and/or other suitable deposition or oxidation processes. As shown in FIG. 11, the CESL 244 may be deposited on top surfaces of the source/drain features 242 and along sidewalls of the gate spacer layer 226. Although the CESL 244 is also deposited over the top surface of the gate spacer layer 226 and the gate top hard mask layer 222, FIG. 11 only illustrates a cross-sectional view of the workpiece 200 after the gate top hard mask layer 222 is removed. Block 118 also includes depositing of the ILD layer 246 over the CESL 244. In some embodiments, the ILD layer 246 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 246 may be deposited by a PECVD process or other suitable deposition technique. A planarization process, such a chemical mechanical polishing (CMP) process may be performed to remove excess materials and hard mask layer 222 to expose top surfaces of dummy gate electrodes 218.

Figure 12:
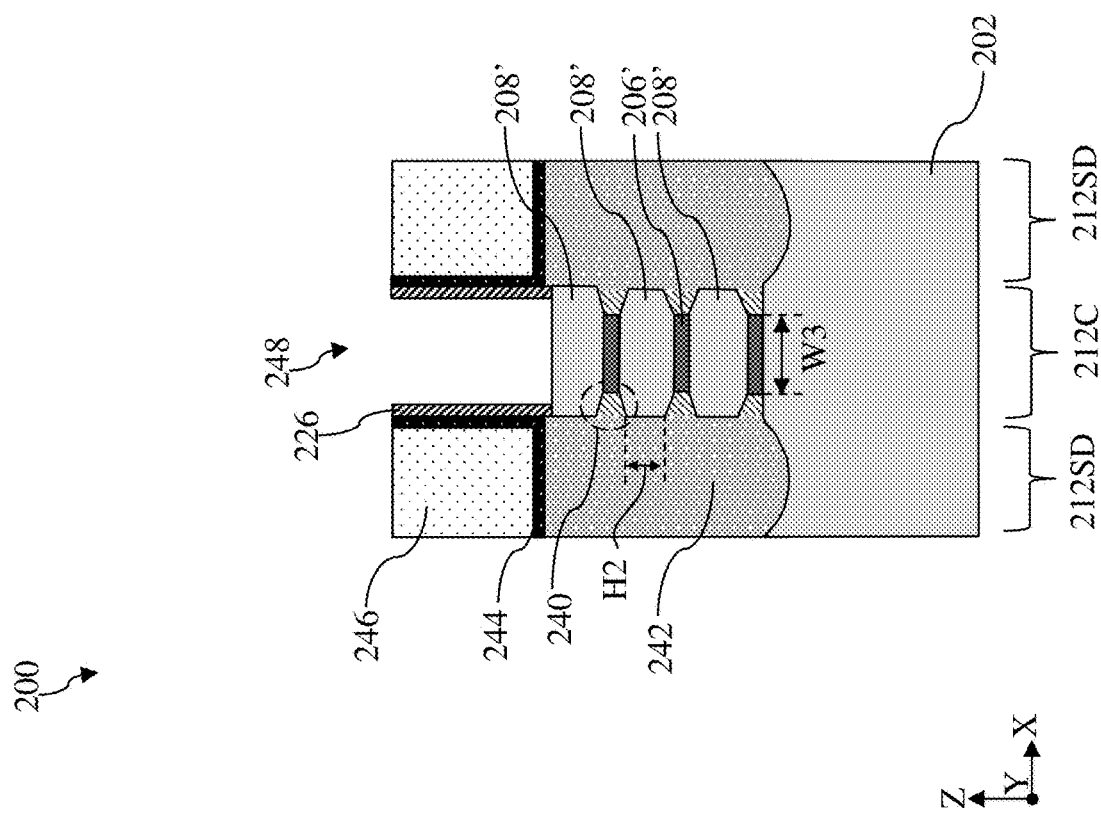

Referring to FIGS. 1 and 12, method 100 includes a block 120 where the dummy gate stack 220 is removed. The removal of the dummy gate stack 220 results in a gate trench 248 over the channel regions 212C. The removal of the dummy gate stack 220 may include one or more etching processes that are selective to the material in the dummy gate stack 220. For example, the removal of the dummy gate stack 220 may be performed using as a selective wet etch, a selective dry etch, or a combination thereof. After the removal of the dummy gate stack 220, sidewalls of the channel layers 208' and sacrificial layers 206' in the channel regions 212C are exposed in the gate trench 248. A gate structure 250 (shown in FIG. 15) may be subsequently formed in the gate trench 248, as will be described below.

Figure 13:
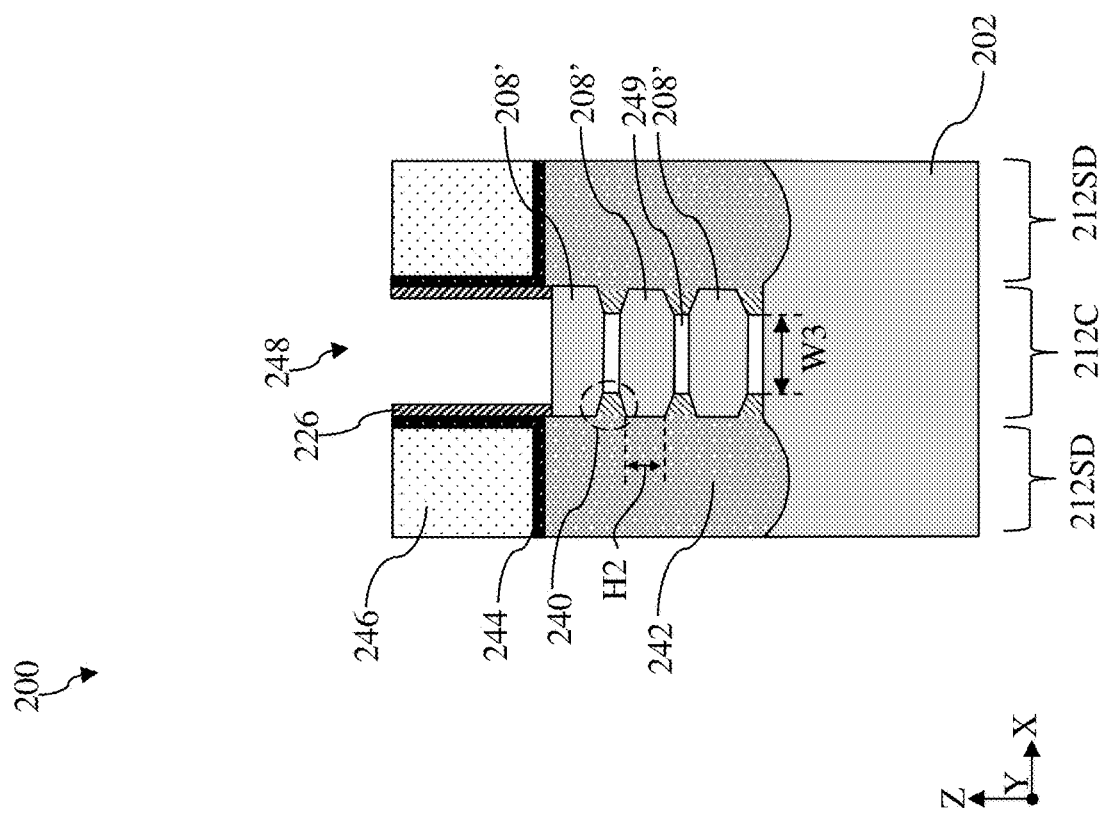

Referring to FIGS. 1 and 13, method 100 includes a block 122 where the sacrificial layers 206' in the channel region 212C are selectively removed to release the channel layers 208' as channel members 208'. The selective removal of the sacrificial layers 206' forms a number of first openings 249 in the channel region 212C. Each first opening 249 may have a height equal to the thickness T1 of the sacrificial layer 206' and a width equal to the W3 of the sacrificial layer 206'. The selective removal of the sacrificial layers 206' may be implemented by selective dry etch, selective wet etch, or other selective etch processes. In one embodiment, the selective removal of the sacrificial layers 206' is performing using a selective wet etch, such as an APM etch (e.g., ammonia hydroxide-hydrogen peroxide-water mixture).

Figure 14:
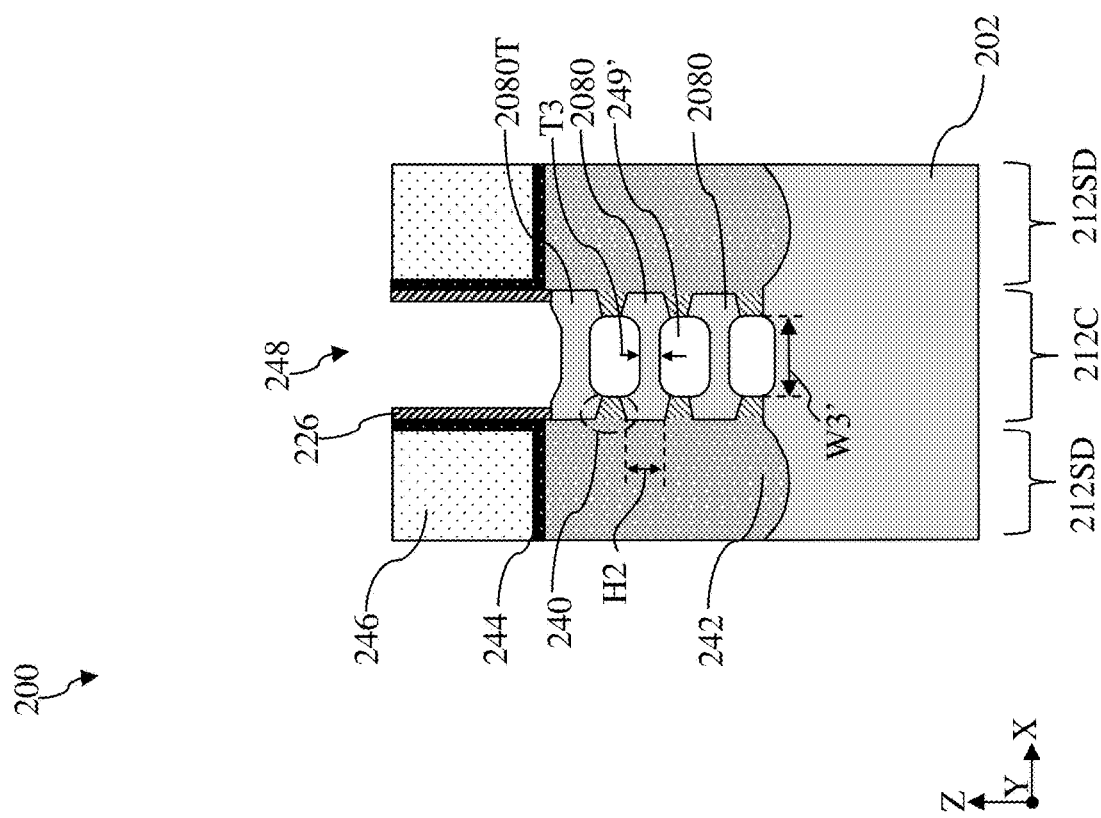

Referring to FIGS. 1 and 14, method 100 includes a block 124 where an etching process is performed to trim (i.e., remove a portion of) the channel layers 208' exposed in the first openings 249. The trimmed channel layers 208' may be referred to as channel members 2080. The etching process may include selective dry etch, selective wet etch, or other selective etch processes. In some embodiments, the trimming process employed in block 124 may be a selective isotropic dry etching process that selectively etches not only an interface of the channel layer 208' that contains germanium impurities from the sacrificial layer 206' but also a portion of the channel layer 208' while not substantially etching the inner spacer features 240. The extent at which the channel layers 208' are recessed is controlled by duration of the etching process. In an embodiment, the selective dry etching process may include use of one or more fluorine-based etchants, such as fluorine gas or hydrofluorocarbons. In some embodiments, the trimming process employed in block 124 is different from the etching process employed in block 122. For example, the etching process employed in block 122 includes a selective wet etching and is performed at a first chamber, the trimming process employed in block 124 includes a selective dry etching and is performed at a second chamber different from the first chamber. The source/drain features 242 are protected from being damaged during this trimming process by the inner spacer features 240.

Figure 19:
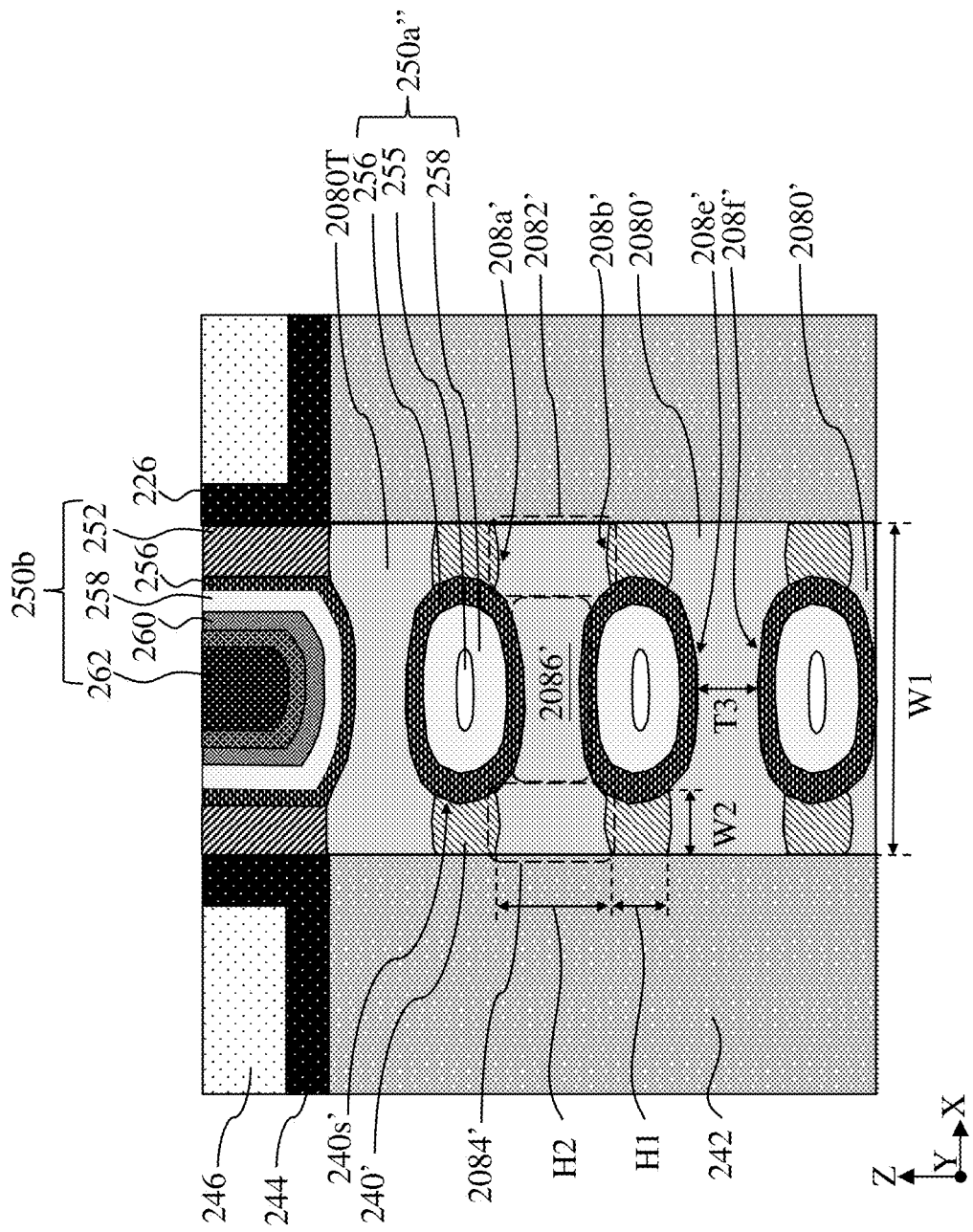
FIG. 19 illustrates an enlarged cross-sectional view of a channel region of another exemplary workpiece fabricated according to the method of FIG. 1, according to one or more aspects of the present disclosure.

As shown in FIG. 14, after trimming, the channel members 2080 are interleaved vertically by a number of second openings 249' and the inner spacer features 240. A cross-sectional view of the second openings 249' along the Y direction includes a substantially rounded rectangular shape or a substantially racetrack shape. A height (along the Z direction) of the second opening 249' is greater than the height of the first opening 249. A width W3' (along the X direction) of the second opening 249' may be substantially equal to the width W3 of the first opening 249. In some embodiments, after trimming, a cross-sectional view of the second opening 249' includes other shapes such as a substantially oval shape. An exemplary gate structure that fills the substantially oval-shaped second opening 249' is shown in FIG. 19.

Still referring to FIG. 14, after trimming, a cross-sectional view of the channel members 2080 includes or resembles a dog-bone shape, a dumbbell shape, or a barbell shape when viewed along the lengthwise direction (i.e., the Y direction). Details for the channel members 2080 are described with reference to FIG. 16. As described earlier, the thickness of the sacrificial layer 206 in the existing technologies directly affect the space for forming gate structure in channel region 212C. In the present disclosure, the thickness T1 of the sacrificial layer 206 is between about 4 nm and 8 nm, and by trimming the channel layers 208' along the Z direction and forming the enlarged second openings 249', the vertical space for the formation of gate structures may be equal to or greater than that of the gate structures in the existing technologies. As such, the formation of the gate structures (to be formed in the enlarged second openings 249') may be facilitated. In addition, trimming the released channel layers 208' in the Z direction would advantageously reduce the germanium impurities in the channel member 2080 that diffuse from the sacrificial layer 206, thus carrier mobility and the performance of the workpiece 200 may be improved.

Referring to FIGS. 1 and 15-17, method 100 include a block 126 where a gate structure 250 is formed over and around the channel members 2080, including into the second openings 249'. The gate structure 250 includes a gate dielectric layer 252 and a gate electrode 254 formed over the gate dielectric layer 252. In an exemplary process, a gate dielectric layer 252 is deposited over the workpiece 200, the gate electrode 254 is deposited over the gate dielectric layer 252, and a planarization process is followed to remove excessive materials. In some embodiments, the gate dielectric layer 252 may include an interfacial layer and a high-k dielectric layer. High-K gate dielectrics, as used and described herein, include dielectric materials having a high dielectric constant, for example, greater than that of thermal silicon oxide (~3.9). The interfacial layer may include a dielectric material such as silicon oxide, hafnium silicate, or silicon oxynitride. The interfacial layer may be deposited using chemical oxidation, thermal oxidation, ALD, CVD, and/or other suitable method. The high-K dielectric layer may include hafnium oxide, titanium oxide, hafnium zirconium oxide, tantalum oxide, hafnium silicon oxide, zirconium silicon oxide, lanthanum oxide, aluminum oxide, zirconium oxide, yttrium oxide, $SrTiO_3$ (STO), $BaTiO_3$ (BTO), BaZrO, hafnium lanthanum oxide, lanthanum silicon oxide, aluminum silicon oxide, hafnium tantalum oxide, hafnium titanium oxide, $(Ba,Sr)TiO_3$ (BST), silicon nitride, silicon oxynitride, combinations thereof, or other suitable material. The high-K dielectric layer may be formed by ALD, physical vapor deposition (PVD), CVD, oxidation, and/or other suitable methods.

The gate electrode 254 of the gate structure 250 may include a single layer or alternatively a multi-layer structure, such as various combinations of a metal layer with a selected work function to enhance the device performance (work function metal layer), a liner layer, a wetting layer, an adhesion layer, a metal alloy or a metal silicide. In various embodiments, the gate electrode 254 may be formed by ALD, PVD, CVD, e-beam evaporation, or other suitable process. In embodiments represented in FIG. 15, the gate electrode 254 is formed by ALD and includes a first work function layer 256 over the workpiece, a second work function layer 258 over the first work function layer 256, a first metal fill layer 260 over the second work function layer 258, and a second metal fill layer 262 over the first metal fill layer 260. The first work function layer 256 and the second work function layer 258 are configured to adjust the threshold voltage Vt of the transistor. The materials of the work function layers 256 and 258 are selected according to whether the respective transistor is an n-type transistor or a p-type transistor. For example, when the semiconductor device 200 includes an n-type transistor, at least one of the first work function layer 256 and the second work function layer 258 may include an n-type work function metal layer. The n-type work function metal layer may include Ti, Al, Ag, Mn, Zr, TiAl, TiAlC, TaC, TaCN, TaSiN, TaAl, TaAlC, TiAlN, other n-type work function material, or combinations thereof. In an embodiment, the first work function layer 256 includes a TiAl layer conformally deposited over the gate dielectric layer 252, the second work function layer 258 includes a TiN layer that is conformally deposited in-situ over the first work function layer 256.

When the semiconductor device 200 includes a p-type transistor, at least one of the first work function layer 256 and the second work function layer 258 may include a p-type work function metal layer. The p-type work function metal layer may include TIN, TaN, Ru, Mo, Al, WN, $ZrSi_2$, $MoSi_2$, $TaSi_2$, $NiSi_2$, WCN, other p-type work function material, or combinations thereof. In an embodiment, the first work function layer 256 includes a TiN layer conformally deposited over the gate dielectric layer 252, the second work function layer 258 includes a TaN layer that is conformally deposited in-situ over the first work function layer 256.

The first metal fill layer 260 and the second metal fill layer 262 are configured to reduce a contact resistance of the transistor. The first metal fill layer 260 and the second metal fill layer 262 may include aluminum (Al), tungsten (W), nickel (Ni), titanium (Ti), ruthenium (Ru), cobalt (Co), platinum (Pt), tantalum silicon nitride (TaSiN), copper (Cu), other refractory metals. In some implementations, the first metal fill layer 260 and the second metal fill layer 262 may be formed of same composition but formed by different process. For example, in an embodiment, the first metal fill layer 260 may include tungsten formed by ALD, and the second metal fill layer 262 may include tungsten formed by CVD. In some implementations, the first metal fill layer 260 and the second metal fill layer 262 may be formed of different compositions. For example, in an embodiment, the first metal fill layer 260 may include tungsten, and the second metal fill layer 262 may include nickel. In some implementations, before the deposition of the first metal fill layer 260 and the second metal layer 262, a corresponding glue layer (e.g., TiN) may be formed over the second work function layer 258.

Figure 15:
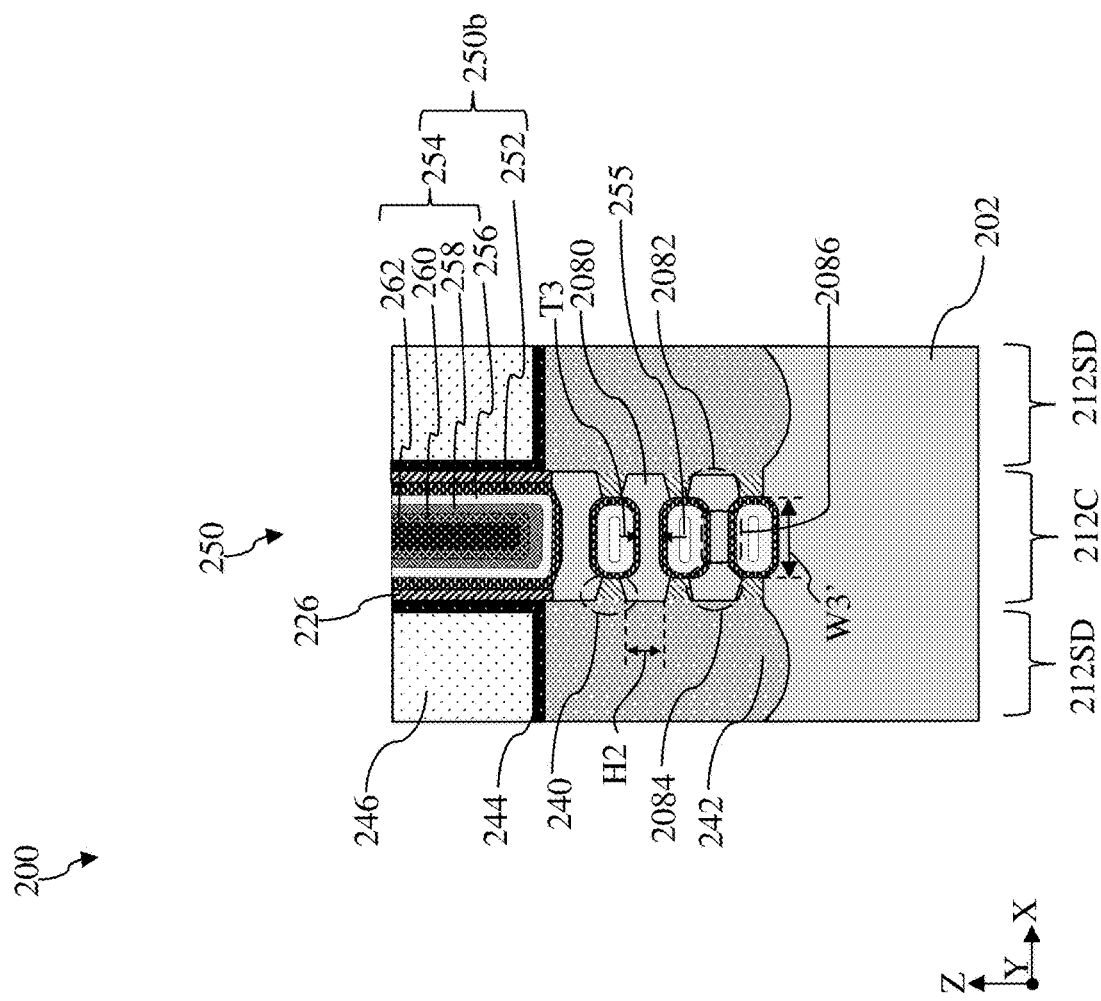
Figure 16:
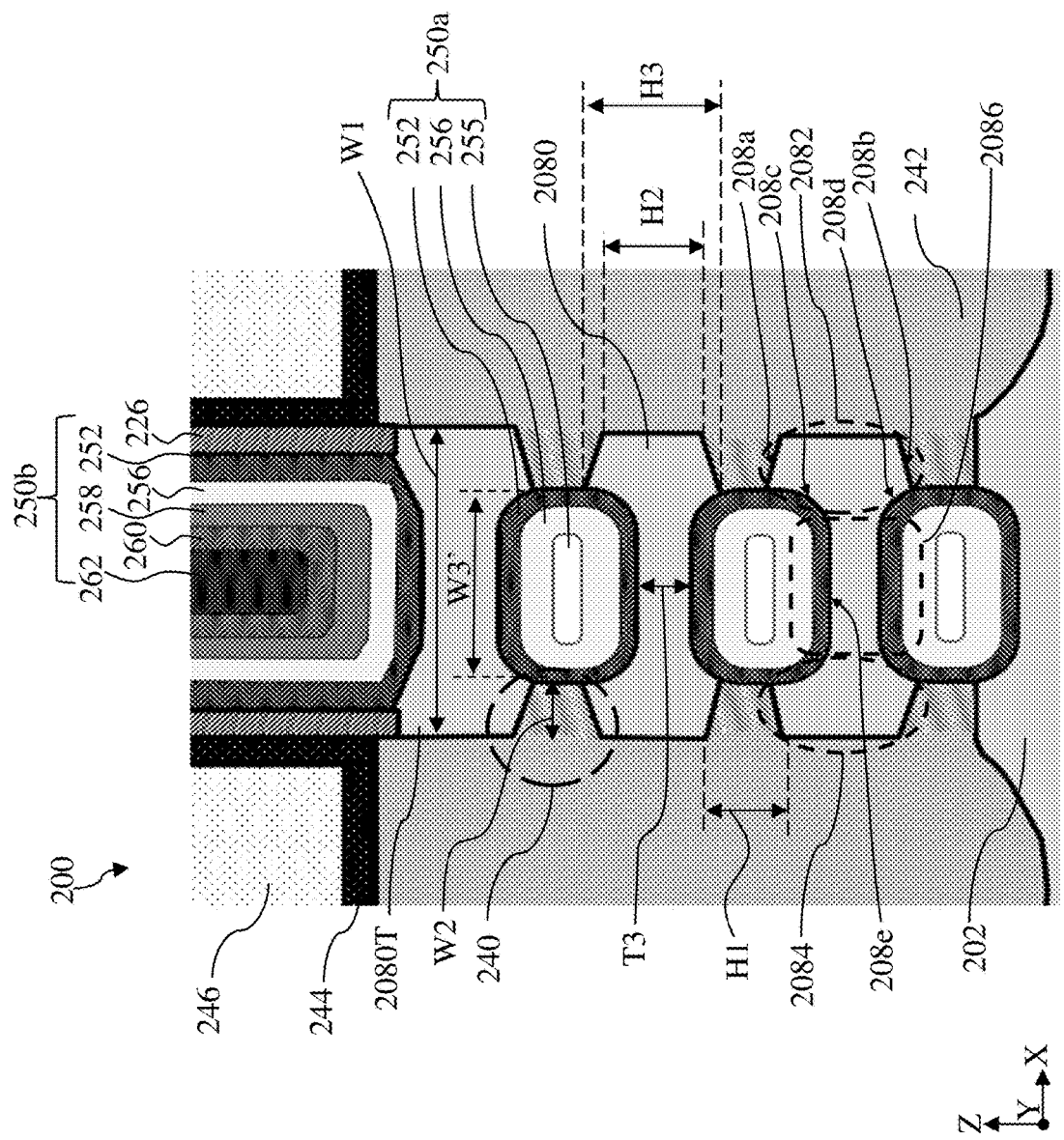
FIG. 16 illustrates an enlarged cross-sectional view of a channel region of the exemplary workpiece shown in FIG. 15, according to one or more aspects of the present disclosure.
Figure 17:
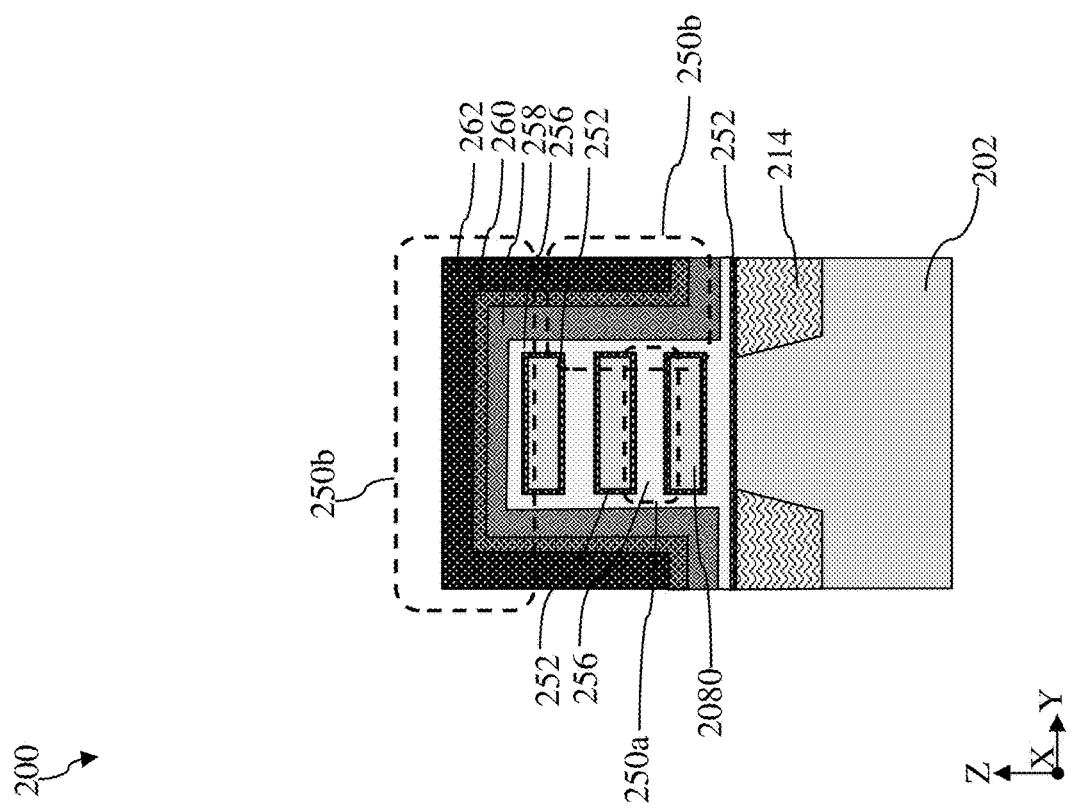
Figure 18:
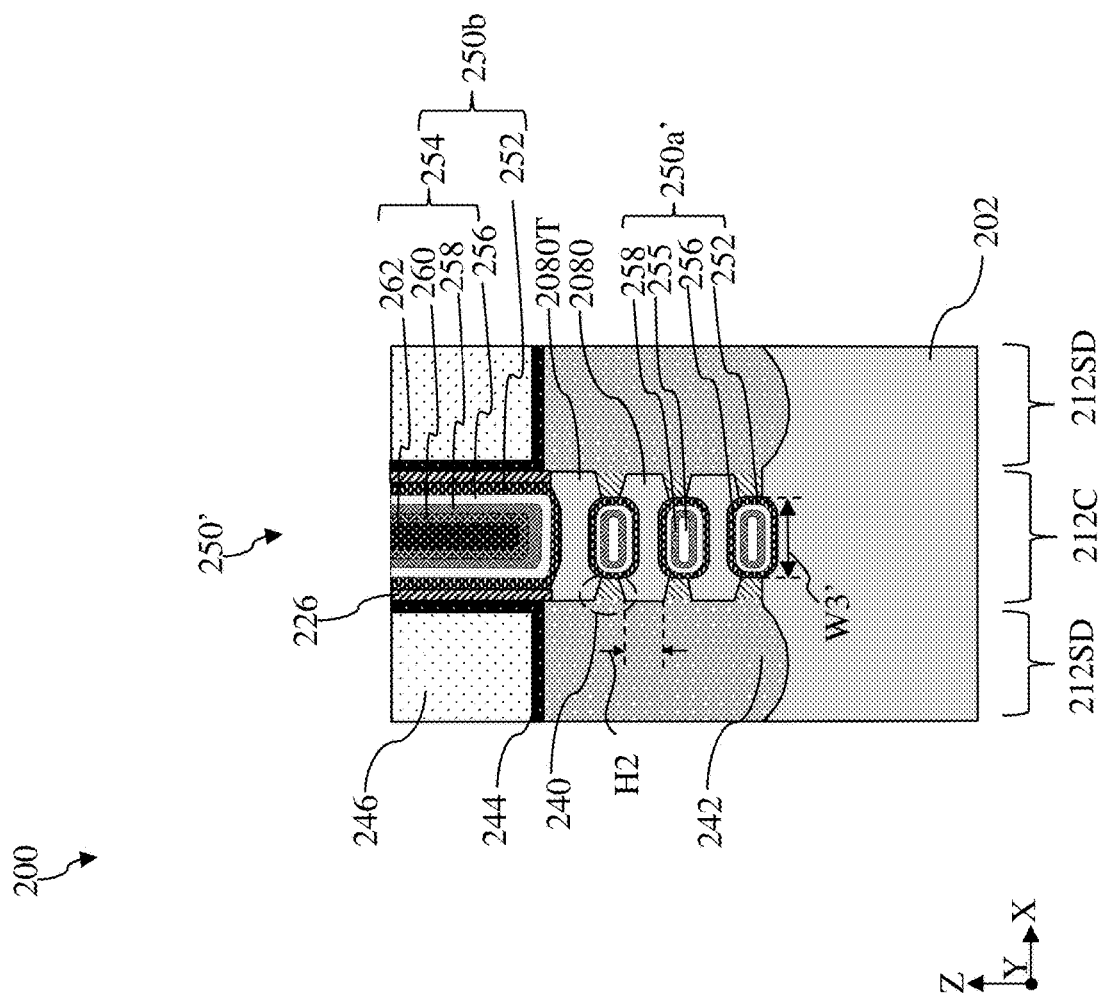
FIG. 18 illustrates a fragmentary cross-sectional view of another exemplary workpiece fabricated according the method of FIG. 1, according to one or more aspects of the present disclosure.

FIG. 16 depicts an enlarged fragmentary cross-sectional view of the channel region 212C in FIG. 15. FIG. 17 depicts a fragmentary cross-sectional view, when viewed from the X direction, of the workpiece 200 of FIG. 15. As shown in FIGS. 16-17, the gate structure 250 includes an inner portion 250a deposited in the second openings 249' in the channel regions 212C and an outer portion 250b formed over the workpiece 200. In this regard, the gate structure 250 wraps around each of the channel members 2080 on the Y-Z plane. A shape of the cross-sectional view of the inner portion 250a of the gate structure 250 tracks the shape of the corresponding second openings 249'. That is, in this depicted example, the shape of the cross-sectional view of the inner portion 250a includes a substantially rounded rectangular shape or a substantially racetrack shape. Due to the dimension of the second opening 249', the inner portion 250a of the gate structure 250 includes the gate dielectric layer 252 wrapping around the channel members 2080 and the first work function layer 256 over and wrapping around the gate dielectric layer 252, and is free of layers 258, 260 and 262. In other words, the inner portion 250a of the gate structure 250 doesn't include the layers 258, 260 and 262. Due to the limitations of ALD deposition process, the second opening 249' is not fully filled and the inner portion 250a also includes a seam (i.e., void) 255 enclosed in the first work function layer 256 and extends along the X direction. The outer portion 250b includes the gate dielectric layer 252, the first work function layer 256, the second work function layer 258, the metal fill layers 260 and 262. That is, the composition of the inner portion 250a is different than the composition of the outer portion 250b of the gate structure 250. In embodiments where the gate structure 250 incudes the glue layer disposed between the second work function layer 258 and the first metal fill layer 260, the inner portion 250a is also free of the glue layer.

As illustrated in FIG. 16, a thickness of each of the channel members 2080 of the present disclosure is not uniform throughout its length along the X direction. More specifically, the channel members 2080 includes a first connection portion 2082 in direct contact with the source/drain feature 242 at the interface 231 (shown in FIG. 7). The first connection portion 2082 is also sandwiched between two vertically adjacent inner spacer features 240 or between the gate spacer layer 226 and the topmost inner spacer feature 240. As shown in FIG. 16, the first connection portion 2082 includes the downward-sloping top surface 208a in direct contact with an upper inner spacer feature 240 and the upward-sloping bottom surface 208b in direct contact with a lower inner spacer feature 240. The first connection portion 2082 also includes a top surface 208c and a bottom surface 208d that are curved inward and in direct contact with at least one round corner of the inner portion 250a formed in the substantially rounded rectangular second openings 249'. As such, a thickness of the first connection portion 2082 is not uniform. The channel members 2080 also includes a second connection portion 2084. The second connection portion 2084 and the first connection portion 2082 are substantially mirror images. The connection portions 2082 and 2084 of the channel member 2080 has an interface height H2 and a dog bone height H3.

The channel members 2080 also includes a channel portion 2086 capped at both ends by the connection portions 2082 and 2084. The channel portion 2086 has a substantially flat top surface 208c and a substantially uniform thickness T3 (along the Z direction). Each of the connection portions 2082 and 2084 connects between the source/drain feature 242 and the channel portion 2086. A ratio of the height H2 to the thickness T3 of the channel layer 208 is between about 1.3 and about 1.9 such that the final structure of the semiconductor device 200 would provide a smaller junction resistance $R_{overlay}$ and thus a smaller on-state resistance compared to those of the MBC transistors with channel members that have a uniform shape. In an embodiment, the thickness T3 may be substantially one half (½) of the thickness T2 (shown in FIG. 2) of the channel layer 208. That is, substantially a half of the channel layer 208' is trimmed at block 124 to form the channel members 2080 and the second openings 249'. In an embodiment, the dog bone height H3 is between about 9.5 nm and about 12.5 nm, the interface height H2 is between about 8 nm and about 12 nm, and the thickness T3 of the channel portion 2086 is between about 3 nm and about 6 nm. As shown in FIG. 16, because the connection portions of the topmost channel member 2080T are not be vertically sandwiched between two inner spacer features 240, the topmost channel member 2080T may have a different shape when viewed along the Y direction.

In the above embodiments described with reference to FIGS. 15-17, the inner portion 250a of the gate structure 250 includes the gate dielectric layer 252, the first work function layer 256 wrapping around the gate dielectric layer 252, and the seam 255 enclosed in the first work function layer 256. In other implementations that have second openings 249' and channel portion 2086 with different dimensions, a composition of the inner portion 250a of the gate structure 250 formed in the second openings 249' may be changed accordingly. In the embodiment represented in FIG. 18, the workpiece 200 includes a gate structure 250'. The formation and composition of the gate structure 250' may be in a way similar to those of the gate structure 250. An inner portion 250a' of the gate structure 250', formed in the second opening 249', includes a gate dielectric layer 252, a first work function layer 256 wrapping around the gate dielectric layer 252, a second work function layer 258 over and wrapping around first work function layer 256, and a seam 255 enclosed in the second work function layer 258. That is, the inner portion 250a' is free of metal fill layers 260 and 262. The composition of the inner portion 250a' is different from that of the outer portion (e.g., formed over the channel members 2080) of the gate structure 250'. It is noted that, due to the dimension of the workpiece 200 and the ALD deposition process implemented in the formation of gate structures, the composition of the inner portion (250a or 250a', 250a" described with reference to FIGS. 15 and 18-19) is different from that of the outer portion 250b and includes a seam formed in the second opening 249'.

In the above embodiments described with reference to FIGS. 7-18, the etching process employed in block 110 and the trimming process employed in block 124 are configured such that the channel member 2080 includes a non-uniform thickness in the connection portions 2082 and 2084 and a substantially uniform thickness in the channel portion 2086. In another exemplary embodiment, the etching process employed in block 110 and the trimming process employed in block 124 may be configured such that the channel member 2080 includes a non-uniform thickness in the channel portion 2086 and a substantially uniform thickness in the connection portions 2082 and 2084.

Referring to FIG. 19, the trimming process employed in block 124 may be configured such that, after the trimming process, a shape of a cross-sectional view of the second opening 249' (filled by the inner portion 250a" of the gate structure 250) is substantially an oval shape when viewed along the Y direction. In this embodiment, as shown in FIG. 19, the channel member 2080' includes a channel portion 2086' capped at both ends by connection portions 2082' and 2084'. The connection portions 2082' and 2084' include a top surface 208a' and a bottom surface 208b' that curve inward and are in direct contact with at least one inner spacer feature 240'. It is noted that, although the top surface 208a' and the bottom surface 208b' are concave, the concaveness does not significantly affect the thickness of the connection portions 2082' and 2084'. The first connection portion 2082' and the second connection portion 2084' each have the substantially uniform thickness H2. The channel portion 2086' also includes a top surface 208e' and a bottom surface 208f' that curve inward and are in direct contact with the inner portion 250a" of the gate structure 250. It is noted that, due to the oval-shape second opening 249' (filled by the inner portion 250a" of the gate structure 250), a thickness of the channel portion 2086' is not uniform. The concaveness of the top surface 208e' is greater than the concaveness of the top surface 208a'. The thinnest part of the channel portion 2086' has a thickness T3. A ratio of H2 to T3 is between about 2 and about 3 such that the final structure of the semiconductor device 200 would provide a smaller junction resistance $R_{overlay}$ and thus a smaller on-state resistance without increasing the difficulty of forming satisfactory gate structures. In an embodiment, H2 is between about 8 nm and about 13 nm, and T3 is between about 3 nm and about 6 nm.

Still referring to FIG. 19, the inner spacer feature 240' is in direct contact with the surfaces of the connection portions 2082' and 2084'. The inner spacer feature 240' thus includes a convex top surface and a convex bottom surface and has a substantially uniform thickness H1 along the Z direction. The convex top surface and bottom surface of the inner spacer feature 240' track the shape of the bottom surface 208b' and top surface 208a', respectively. The inner spacer feature 240' also includes a sidewall surface 240s' that is in direct contact with the inner portion 250a" of the gate structure formed in the second opening 249'. Due to the substantially oval shape of the second opening 249', the sidewall surface 240s' curves inward. The thickest part of the inner spacer feature 240' has a width W2. A ratio of W2 to H1 is between about 0.9 and about 1.2 to isolate the gate structure from source/drain features 242 and protect source/drain features from being damaged during the trimming process. In an embodiment, the width W2 is between about 4 nm and about 8 nm, and the height H1 may be between about 4 nm and about 8 nm. A ratio of W2 to a thickness H2 is between about 0.45 to about 0.65. A ratio of a width W2 of the first connection portion 2082' to a width W1 of channel member is between about 0.15 to about 0.25 and a ratio of a width (along the X direction, W1−2*W2) of the channel portion 2086' to the width W1 of the channel member is between about 0.5 and about 0.7 to obtain satisfactory gate-channel coupling.

Referring to FIGS. 1 and 15-19, method 100 include a block 128 where further processes may be performed to complete the fabrication of the semiconductor device 200. For example, such further processes may form various contacts/vias, metal lines, power rails, as well as other multilayer interconnect features, such as ILD layers and/or etch stop layer (ESLs) over the semiconductor device 200, configured to connect the various features to form a functional circuit that includes the different semiconductor devices.

Although not intended to be limiting, one or more embodiments of the present disclosure provide many benefits to a semiconductor device and the formation thereof. For example, embodiments of the present disclosure provide dog-bone shaped channel members such that the junction overlay region of the semiconductor device is increased without reducing the dimension of the inner portion of gate structures formed in the channel region. Because the junction overlay region is increased, the junction resistance $R_{overlay}$ associated with junction overlay region would be advantageously reduced. Comparing to the junction resistance $R_{overlay}$ of MBC transistors in the existing technologies, the junction resistance $R_{overlay}$ may be reduced by about 25% to about 35%. In addition, the trimming process of removing a portion of the channel member reduces the impurities in the channel member, improving the carrier mobility and thus improving the device performance.

The present disclosure provides for many different embodiments. Semiconductor devices and methods of fabrication thereof are disclosed herein. An exemplary method includes forming a stack over a substrate, and the stack includes a plurality of silicon layers interleaved by a plurality of silicon germanium layers and each silicon germanium layer has a first thickness T1 and each silicon layer has a second thickness T2, T1 is smaller than T2. The exemplary method also includes forming a fin-shaped structure from the stack and the substrate, the fin-shaped structure including a channel region and a source/drain region. The exemplary method also includes forming a dummy gate stack over the channel region, recessing the source/drain region to form a source/drain trench that exposes sidewalls of the plurality of silicon layers and the plurality of silicon germanium layers, selectively and partially recessing the plurality of silicon germanium layers to form a plurality of inner spacer recesses, forming a plurality of inner spacer features in the plurality of inner spacer recesses, forming a source/drain feature in the source/drain trench, removing the dummy gate stack, selectively removing the plurality of silicon germanium layers in the channel region, trimming the plurality of silicon layers in the channel region to form a plurality of trimmed silicon layers, and forming a gate structure to wrap around each of the plurality of trimmed silicon layers. A shape of a cross-sectional view of each of the plurality of trimmed silicon layers includes a dog-bone shape.

In some embodiments, a ratio of T2 to T1 may be between about 1.5 and about 3. In some embodiments, a germanium content of the plurality of silicon germanium layers may be between about 15% and about 30%. In some embodiments, the forming of the gate structure may include forming a first work function layer to wrap around each of the plurality of trimmed silicon layers, forming a second work function layer over the first work function layer to wrap around each of the plurality of trimmed silicon layers, and forming a metal fill layer over the second work function layer. The metal fill layer does not extend between two adjacent trimmed silicon layers of the plurality of trimmed silicon layers.

In some embodiments, the gate structure may include a seam enclosed in the second work function layer. In some embodiments, the selectively removing of the plurality of silicon germanium layers may include performing a first etching process, and the trimming of the plurality of silicon layers may include performing a second etching process different from the first etching process. In some embodiments, an inner spacer feature of the plurality of inner spacer features has a thickness T3 and a width W1, a ratio of the width W1 to the thickness T3 is between about 0.9 and about 1.2. In some embodiments, each of the plurality of trimmed silicon layers may include an end portion in direct contact with the source/drain feature and a channel portion wrapped around by or in contact with the gate structure. A thickness of the end portion is greater than a thickness of the channel portion.

Another exemplary method includes receiving a workpiece that includes a substrate and a stack over the substrate. The stack includes a plurality of channel layers interleaved by a plurality of sacrificial layers, a ratio of a thickness T2 of each of the plurality of channel layers to a thickness T1 of each of the plurality of sacrificial layers is between about 1.5 and about 3. The exemplary method also includes patterning the stack and the substrate to form a fin-shaped structure, forming a dummy gate stack over a channel region of the fin-shaped structure while source/drain regions of the fin-shaped structure are exposed, recessing source/drain regions to form source/drain trenches that expose sidewalls of the plurality of channel layers and the plurality of sacrificial layers, selectively and partially etching the plurality of sacrificial layers to form inner spacer recesses, forming inner spacer features in the inner spacer recesses, wherein each inner spacer feature directly contacts a corresponding channel layer and a corresponding sacrificial layer, removing the dummy gate stack, and selectively removing the plurality of sacrificial layers to form a first plurality of openings in the channel region. The exemplary method also includes, after the selective removing, performing an etching process to trim the plurality of channel layers exposed in the first plurality of openings to form a plurality of channel members interleaved by a second plurality of openings and forming a gate structure over the workpiece. Each of the plurality of channel members includes two end portions and a connecting portion that extend between the two end portions, a thickness of each of the two end portions is greater than a thickness of the connecting portion.

In some embodiments, a ratio of a width of an inner spacer feature to a thickness of the inner spacer feature may be between about 0.9 and about 1.2. In some embodiments, the gate structure may include an inner portion disposed in the second plurality of openings and an outer portion disposed over the inner portion, a composition of the inner portion may be different than a composition of the outer portion.

In some embodiments, the forming of the gate structure over the workpiece may include depositing a work function layer over the workpiece and forming a metal fill layer over the work function layer. The outer portion may include the work function layer and the metal fill layer. In some embodiments, the inner portion may include a seam enclosed in the work function layer. In some embodiments, a shape of a cross-sectional view of the inner portion may include an oval shape. In some embodiments, the work function layer may include a titanium aluminum layer and a titanium nitride layer formed over the titanium aluminum layer, the metal fill layer may include tungsten. In some embodiments, each of the plurality of channel layers may include silicon, each of the plurality of sacrificial layers may include silicon germanium, and a germanium content of the silicon germanium may be between about 15% and about 30%.

An exemplary semiconductor device includes a source feature, a drain feature, a channel member disposed between the source feature and the drain feature. The channel member may include a first connection portion in direct contact with the source feature, a second connection portion in direct contact with the drain feature, and a channel portion extending between the first connection portion and the second connection portion, a thickness of the first connection portion is greater than a thickness of the channel portion. The exemplary semiconductor device also includes a first inner spacer feature disposed over and in contact with the first connection portion, a second inner spacer feature disposed under and in contact with the first connection portion, and a gate structure wrapping around the channel portion of the channel member. A ratio of a thickness of the first inner spacer feature to a width of the first inner spacer feature is between about 0.9 and about 1.2.

In some embodiments, the gate structure may include an inner portion disposed between the source feature and the drain feature and an outer portion disposed over the source feature and the drain feature. A composition of the inner portion may be different from a composition of the outer portion. In some embodiments, the inner portion may include a first work function layer and a second work function layer. The first work function layer wraps around the channel member, and the second work function layer is over and wrapping around the first work function layer. The outer portion may include the first work function layer, the second work function layer, and a metal fill layer over the second work function layer. In some embodiments, the inner portion further may include a seam enclosed in the second work function layer.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a substrate;
two source/drain features disposed on the substrate;
a stack of channel layers disposed over the substrate and between the two source/drain features; and
a gate structure disposed over and wrapping around the stack of channel layers,
wherein at least one channel layer of the stack of channel layers has a dog-bone shape in a cross-sectional view including the two source/drain features and the stack of channel layers,
wherein the dog-bone shape has top surfaces declining from the gate structure toward the two source/drain features, and
wherein the gate structure comprises a seam.

2. The semiconductor device of claim 1,
wherein the gate structure comprises an inner portion interleaving with the stack of channel layers and an outer portion disposed over the inner portion and the stack of channel layers,
wherein a composition of the inner portion is different from a composition of the outer portion.

3. The semiconductor device of claim 2, wherein the inner portion comprises the seam.

4. The semiconductor device of claim 2, wherein the inner portion has a substantially rounded rectangular shape, a substantially racetrack shape, or a substantially oval shape in the cross-sectional view.

5. The semiconductor device of claim 1, wherein a bottom surface of the gate structure is below a top surface of the substrate.

6. The semiconductor device of claim 1, further comprising an inner spacer feature disposed between two adjacent channel layers of the stack of channel layers and between the gate structure and one of the two source/drain features.

7. The semiconductor device of claim 6, wherein an interface of the inner spacer feature and one of the two adjacent channel layer of the stack of channel layers is tilted and intersects the gate structure,
wherein the inner spacer has a vertical thickness increasing from the gate structure toward the one of the two source/drain features.

8. The semiconductor device of claim 6, wherein a top surface and a bottom surface of the inner spacer feature are concave.

9. The semiconductor device of claim 1, further comprising a gate spacer disposed on a sidewall of the gate structure and on a top surface of a topmost channel layer of the stack of channel layers,
wherein the gate structure and the topmost channel layer of the stack of channel layers has a tilted interface.

10. A semiconductor device, comprising:
a first source/drain feature and a second source/drain feature;
a channel member disposed between the first source/drain feature and the second source/drain feature, wherein the channel member comprises a first connection portion contacting the first source/drain feature, a second connection portion contacting the second source/drain feature, and a channel portion extending between the first connection portion and the second connection portion, wherein a thickness of the first connection portion is greater than a thickness of the channel portion;
an inner spacer feature disposed below a tilted bottom surface of the first connection portion; and
a gate structure disposed over and wrapping around the channel member,
wherein the tilted bottom surface of the first connection portion declines from the first source/drain feature toward the gate structure.

11. The semiconductor device of claim 10,
wherein the gate structure comprises an inner portion wrapping around the channel member and an outer portion disposed over the inner portion and the channel member,
wherein the inner portion comprises a gate dielectric material wrapping around the channel member, and a first work function material over and wrapping around the gate dielectric material, and
wherein the outer portion comprises the gate dielectric material, the first work function material over the gate dielectric material, a second work function material over the first work function material, and a metal fill material over the second work function material.

12. The semiconductor device of claim 11, wherein the inner portion has a substantially rounded rectangular shape or a substantially racetrack shape in a cross-sectional view including the first source/drain feature, the second source/drain feature, the channel member, and the gate structure.

13. The semiconductor device of claim 11, wherein the inner portion further comprises a void surrounded by the first work function material.

14. The semiconductor device of claim 10, further comprising a substrate,
wherein the first source/drain feature and the second source/drain feature are disposed on the substrate, and
wherein the gate structure extends into the substrate.

15. The semiconductor device of claim 10, further comprising a gate spacer disposed on a sidewall of a portion of the gate structure and a top surface of the first connection portion,
wherein the portion of the gate structure and the first connection portion have a tilted interface.

16. The semiconductor device of claim 10,
wherein a top surface of the first connection portion declines from the gate structure toward the first source/drain feature.

17. A semiconductor device, comprising:
a substrate;
a source feature and a drain feature disposed over the substrate;
a channel member disposed between the source feature and the drain feature, wherein the channel member comprises a first connection portion contacting the source feature, a second connection portion contacting the drain feature, and a channel portion extending between the first connection portion and the second connection portion, wherein a thickness of the first connection portion is greater than a thickness of the channel portion;
a first inner spacer feature disposed on a top surface of the first connection portion;
a second inner spacer feature landing on a bottom surface of the first connection portion; and a gate structure wrapping around the channel portion of the channel member, wherein the first connection portion of the channel member interfaces the gate structure, wherein a ratio of a thickness of the first inner spacer feature to a width of the first inner spacer feature is between about 0.9 and about 1.2, and wherein a portion of the gate structure extends into the substrate.

18. The semiconductor device of claim 17, wherein the gate structure comprises an inner portion disposed between the source feature and the drain feature and an outer portion disposed over the source feature and the drain feature, wherein a composition of the inner portion is different from a composition of the outer portion, wherein the first connection portion of the channel member is disposed on the inner portion of the gate structure, and wherein the bottom surface of the first connection portion declines from the source feature toward the inner portion of the gate structure.

19. The semiconductor device of claim 18, wherein the inner portion comprises a first gate dielectric layer wrapping around the channel member, and a first work function layer over the first gate dielectric layer, and wherein the outer portion comprises a second gate dielectric layer, a second work function layer over the second gate dielectric layer, a third work function layer over the second work function layer, and a metal fill layer over the third work function layer.

20. The semiconductor device of claim 19, wherein the inner portion further comprises a seam enclosed in the first work function layer.

* * * * *